(12) United States Patent
Watanabe et al.

(10) Patent No.: US 9,177,847 B2
(45) Date of Patent: Nov. 3, 2015

(54) CERAMIC MEMBER AND MEMBER FOR SEMICONDUCTOR MANUFACTURING EQUIPMENT

(71) Applicant: NGK Insulators, Ltd., Nagoya (JP)

(72) Inventors: Atsushi Watanabe, Nagoya (JP); Noboru Nishimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 58 days.

(21) Appl. No.: 14/195,125

(22) Filed: Mar. 3, 2014

(65) Prior Publication Data

US 2014/0285943 A1  Sep. 25, 2014

(30) Foreign Application Priority Data

Mar. 22, 2013 (JP) ................................ 2013-060006

(51) Int. Cl.
*H01L 21/683* (2006.01)
*H01T 23/00* (2006.01)

(52) U.S. Cl.
CPC .................................. *H01L 21/6833* (2013.01)

(58) Field of Classification Search
USPC ........................................................ 361/234
See application file for complete search history.

(56) References Cited

U.S. PATENT DOCUMENTS

| 8,889,273 | B2* | 11/2014 | Thimm et al. | 428/702 |
|---|---|---|---|---|
| 2007/0138601 | A1* | 6/2007 | Fan et al. | 257/632 |
| 2008/0016684 | A1* | 1/2008 | Olechnowicz et al. | 29/748 |
| 2010/0051995 | A1* | 3/2010 | Katsuno et al. | 257/98 |
| 2014/0130743 | A1* | 5/2014 | Toriya et al. | 118/725 |

FOREIGN PATENT DOCUMENTS

JP  07-297265 A  11/1995
JP  2011-086919 A  4/2011

* cited by examiner

*Primary Examiner* — Dharti Patel
(74) *Attorney, Agent, or Firm* — Burr & Brown, PLLC

(57) ABSTRACT

A member 20 for semiconductor manufacturing equipment includes a base portion 22 and a ceramic member 30 formed on the base portion 22. The ceramic member 30 of the present invention includes a ceramic base 32 containing at least one of magnesium oxide, a magnesium oxide solid solution in which a predetermined component is dissolved in magnesium oxide, and zirconium oxide; and an electrode 34 which is arranged on part of the ceramic base 32 and which contains a ruthenium-aluminum alloy as an electrode component. The ceramic member 30 is a plate-like member and has a structure in which the electrode 34 is embedded therein. The electrode 34 is connected to a feeding member 26 inserted from the underside of the ceramic member 30. Electric power is supplied from the feeding member 26.

15 Claims, 6 Drawing Sheets

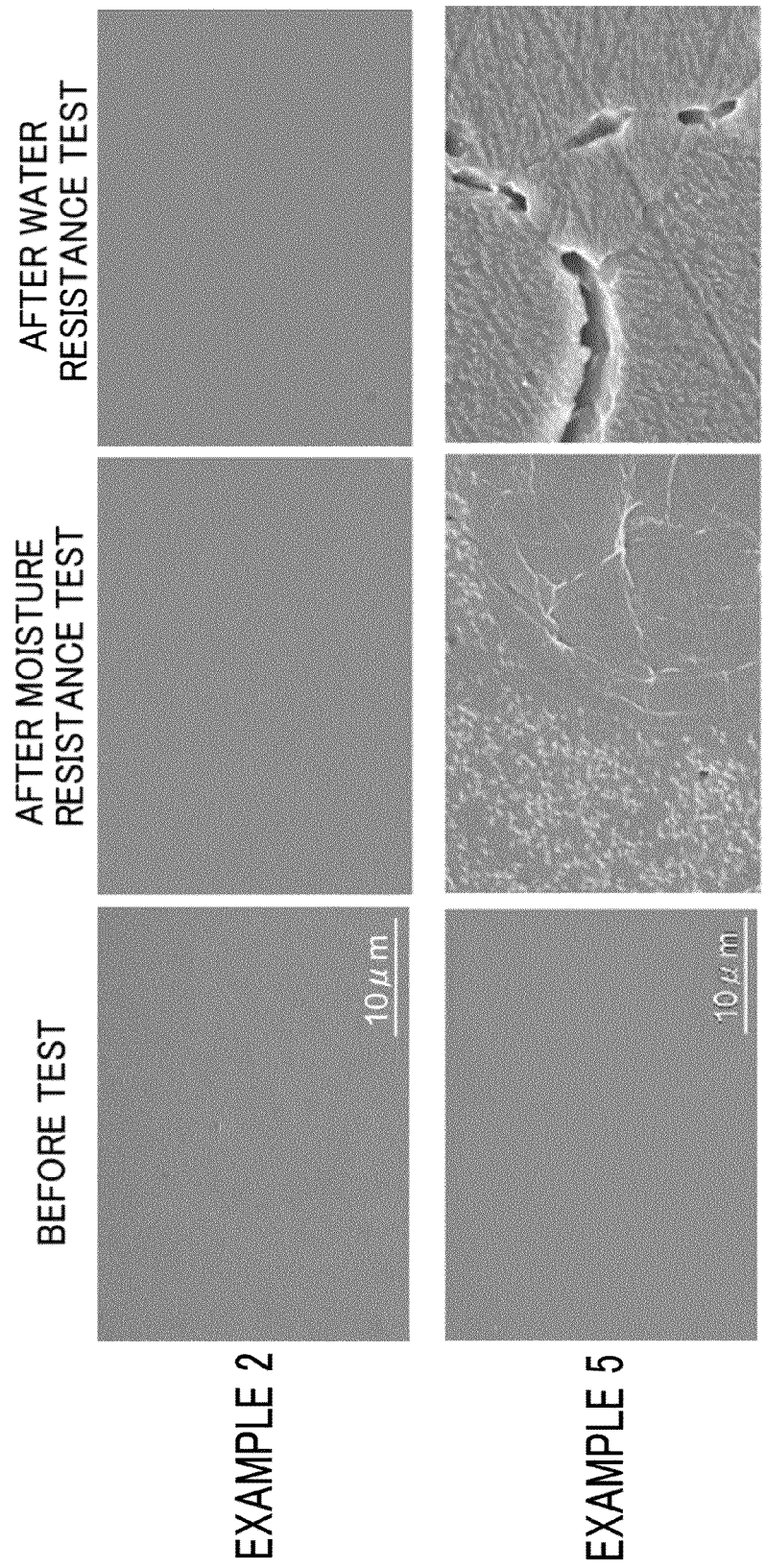

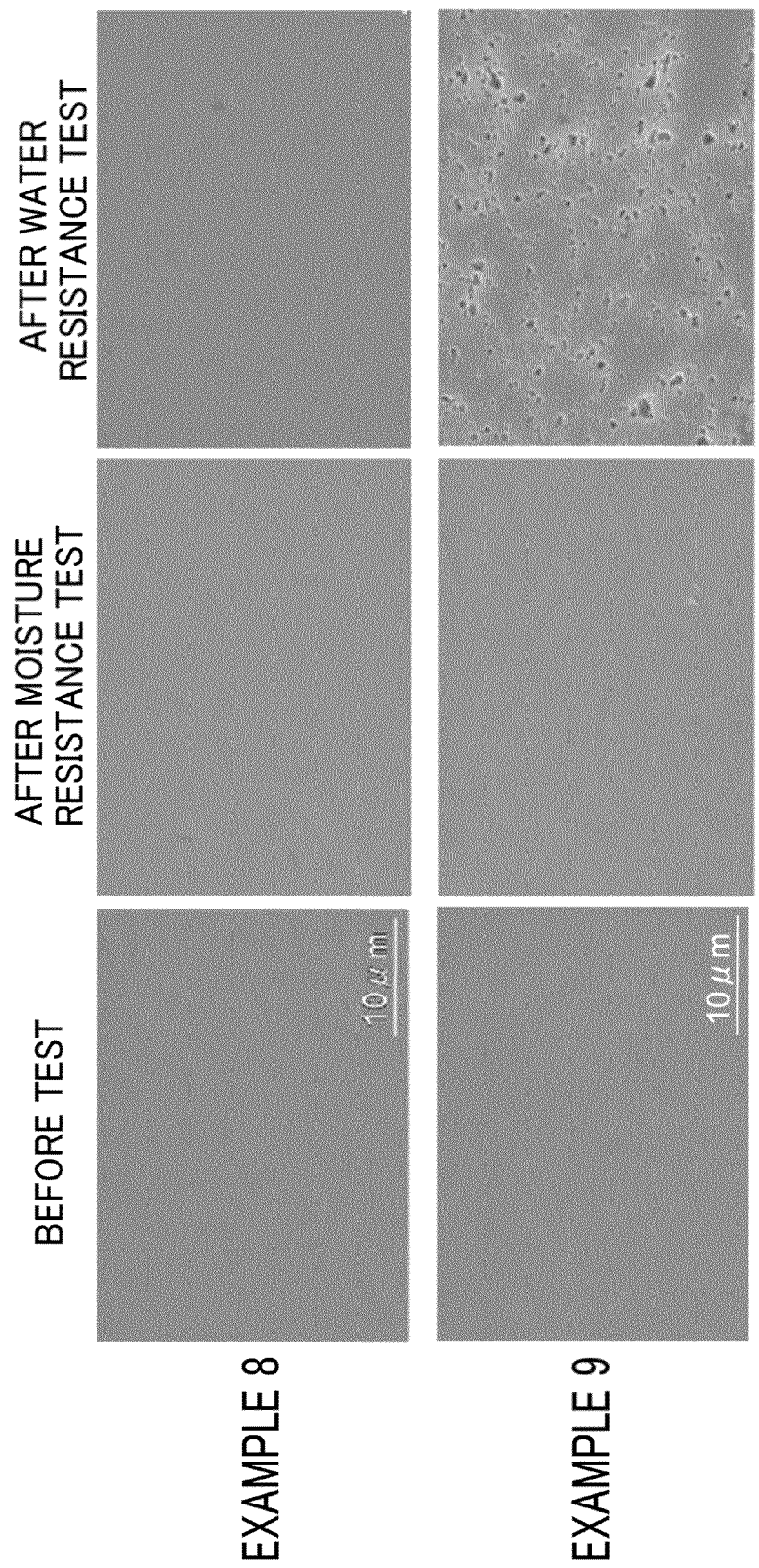

CERAMIC MEMBER AND MEMBER FOR SEMICONDUCTOR MANUFACTURING EQUIPMENT

BACKGROUND OF INVENTION

1. Field of the Invention

The present invention relates to a ceramic member and a member for semiconductor manufacturing equipment.

2. Description of the Related Art

Hitherto, as a member for semiconductor manufacturing equipment, an electrostatic chuck including an insulating dielectric layer composed of aluminum oxide and an electrode mainly composed of tungsten or tungsten carbide is reported, in which a surface of the insulating dielectric layer adjacent to a chuck surface has a surface roughness Ra of 0.25 µm or less and a flatness of 20 µm or less (for example, see PTL 1). This electrostatic chuck has high responsiveness including the saturation time of an electrostatic attractive force and the lost time of a residual attractive force and is highly efficient. Furthermore, as a member for semiconductor manufacturing equipment, an electrostatic chuck including a base composed of magnesium oxide and an electrode composed of at least one metal selected from the group consisting of Ni, Co, and Fe is reported (for example, see PTL 2). In this electrostatic chuck, the occurrence of a microcracking and warpage can be suppressed, and the diffusion of an electrode material in a dielectric layer can be prevented.

PTL 1: JP 7-297265 A
PTL 2: JP 2011-86919 A

SUMMARY OF THE INVENTION

However, in the case where the electrode material described in PTL 1 is used for a ceramic member including a ceramic base mainly composed of magnesium oxide or zirconium oxide, the resulting ceramic member has problems, such as the occurrence of cracking due to a difference in thermal expansion coefficient and the diffusion of an electrode material in the ceramic base, arise, in sane cases. The electrode material described in PTL 2 contains a magnetic element. Thus, the electrode material is required to have further improved properties suitable for electrostatic chucks. That is, there remains a need for a more suitable electrode used for a base mainly composed of magnesium oxide or zirconium oxide.

The present invention has been accomplished in light of the foregoing circumstances. It is a main object of the present invention to provide a ceramic member which contains magnesium oxide or zirconium oxide and which includes an electrode having improved properties, and a member for semiconductor manufacturing equipment.

The Inventors have conducted intensive studies in order to achieve the foregoing main object and have found that the use of an electrode composed of an alloy containing ruthenium and aluminum is more preferred because, for example, it suppresses the occurrence of cracking, further reduces resistivity, and further suppresses the diffusion of an electrode material in a base. This finding has led to the completion of the present invention.

A ceramic member of the present invention includes:

a ceramic base containing at least one of magnesium oxide, a magnesium oxide solid solution in which a predetermined component is dissolved in magnesium oxide, and zirconium oxide; and an electrode arranged on part of the ceramic base, the electrode containing a ruthenium-aluminum allay serving as an electrode component.

A member for semiconductor manufacturing equipment of the present invention includes the foregoing ceramic member.

A ceramic member and a member for semiconductor manufacturing equipment of the present invention may be provided with an electrode having further improved properties. For example, it suppresses the occurrence of cracking, further reduces resistivity, and further suppresses the diffusion of an electrode material in a base, which is more preferred. The reason for this is presumably as follows: For example, magnesium oxide and zirconium oxide have high corrosion resistance, relatively high melting points (for example, 1600° C. or higher), and relatively high thermal expansion coefficients (for example, 10 to 13 ppm/K). In contrast, a ruthenium-aluminum alloy has a relatively high melting point owing to Ru, a relatively high thermal expansion coefficient owing to Al, and a low reactivity to the ceramic base, even in an alloy state. Furthermore, by adjusting a Ru/Al ratio, the thermal expansion coefficient can be adjusted to a value close to those of magnesium oxide and zirconium oxide. For this reason, it may be possible to suppress the occurrence of cracking, further reduce resistivity, and further suppress the diffusion of an electrode material in a base.

BRIEF DESCRIPTION OF THE DRAWINGS

FIG. 6 illustrates photographs of microstructures of bulk materials in Experimental Examples 2 and 5 before and after a moisture resistance test and a water resistance test.

FIG. 7 illustrates photographs of microstructures of bulk materials in Experimental Examples 8 and 9 before and after the moisture resistance test and the water resistance test.

DESCRIPTION OF THE PREFERRED EMBODIMENTS

Figure 1:
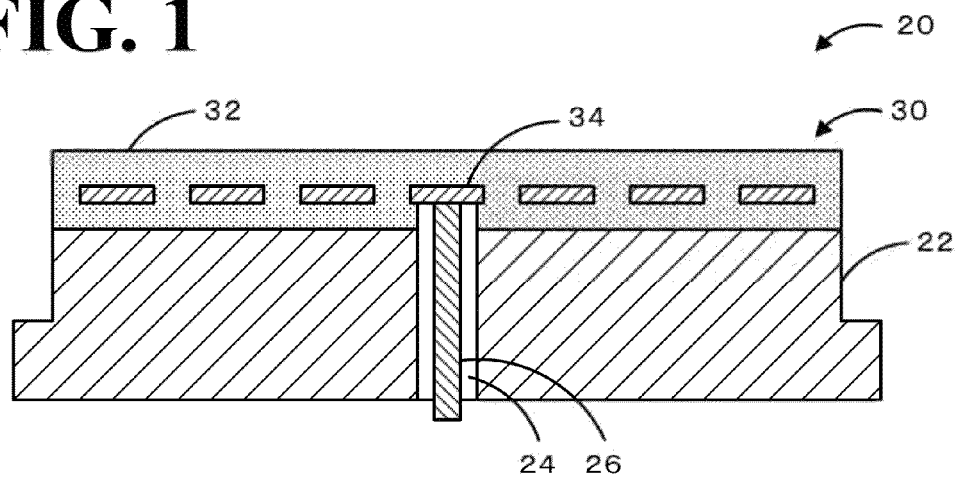
FIG. 1 is a configuration diagram schematically illustrating of an exemplary structure of a member 20 for semiconductor manufacturing equipment.
Figure 2:
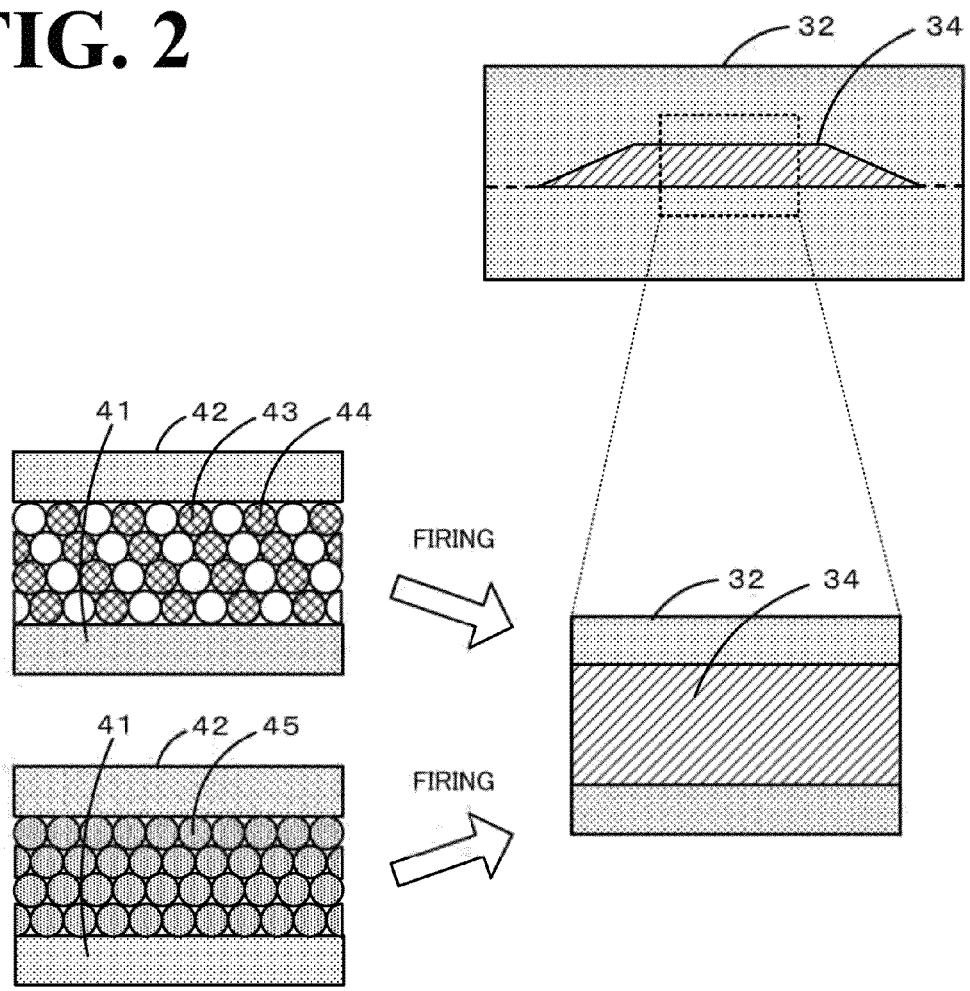
FIG. 2 is an explanatory drawing of an exemplary process for producing the member 20 for semiconductor manufacturing equipment.

Embodiments of the present invention will be described below with reference to the drawings. FIG. 1 is an example of a configuration drawing schematically illustrating the structure of a member 20 for semiconductor manufacturing equipment according to an embodiment of the present invention. The meter 20 for semiconductor manufacturing equipment includes a base portion 22 and a ceramic member 30 formed an the base portion 22. A through hole 24 is provided in the base portion 22 of the member 20 for semiconductor manufacturing equipment. A rod-like feeding member 26 is inserted in the through hole 24. A heater electrode configured to heat the ceramic member 30 may be embedded in the base portion 22. The ceramic member 30 of the present invention includes a ceramic base 32 containing at least one of magnesium oxide, a magnesium oxide solid solution in which a predetermined component is dissolved in magnesium oxide, and zirconium oxide; and an electrode 34 which is arranged on part of the ceramic base 32 and which contains a ruthenium-aluminum alloy as an electrode component. The ceramic member 30 is a plate-like member and has a structure in which the electrode 34 is embedded therein. The electrode 34 is connected to the feeding member 26 inserted from the underside of the ceramic member 30. Electric power is supplied from the feeding member 26. The ceramic member of the present invention will be described below.

The ceramic base used in the ceramic member of the present invention contains at least one of magnesium oxide, a magnesium oxide solid solution in which a predetermined component is dissolved in magnesium oxide, and zirconium oxide. Examples of the magnesium oxide solid solution include solid solutions in which one or more of Al, N, Ga, Zr, Li, and so forth are dissolved in magnesium oxide. Among these, for example, the ceramic base preferably contains the magnesium oxide solid solution having a crystal phase of Mg(Al)O(N) in which Al and N components are dissolved in magnesium oxide, the crystal phase serving as a main phase. Mg(Al)O(N) has corrosion resistance comparable to magnesium oxide and has superior moisture resistance and water resistance to magnesium oxide. Thus, the ceramic base whose main phase is the crystal phase of Mg(Al)O(N) has excellent corrosion resistance, moisture resistance, and water resistance. In the ceramic base of the present invention, the addition of aluminum nitride and alumina to magnesium oxide significantly results in a significant increase in the solid solubilities of Al and N components. Thus, the Mg(Al)O(N) may contain a large amount of Al with respect to the solid solubility of N. The ceramic base of the present invention may contain zirconium oxide or zirconium oxide containing a stabilizer. For example, as the zirconium oxide, partially stabilized zirconia or fully stabilized zirconia containing a stabilizer, for example, yttrium oxide, calcium oxide, magnesium oxide, or cerium oxide may be used. Alternatively, a composite material of zirconium oxide and aluminum oxide may be used.

An XRD peak corresponding to the (111), (200), or (220) plane of the Mg(Al)O(N) measured with CuKα radiation may appear at 2θ=36.9 to 39°, 42.9 to 44.8°, or 62.3 to 65.2°, the XRD peak being located between a peak of cubic magnesium oxide and a peak of cubic aluminum nitride. While the XRD peak appears in the range described above, the peak is not clearly distinguished from peaks corresponding to other crystal phases, in sane cases. Thus, one XRD peak may appear in the range described above. Higher solid solubility of Al and N components result in improvements in moisture resistance and water resistance. The XRD peaks of magnesium oxide shift to higher angles with increasing solid solubility. Thus, when the XRD peaks corresponding to the (200) and (220) planes of the Mg(Al)O(N) appear at 2θ=42.92° or more and 62.33° or more, respectively, the moisture resistance can be further enhanced, which is preferred. When the XRD peaks corresponding to the (200) plane and the (220) plane of the Mg(Al)O(N) appear at 2θ=42.95° or more and 62.35° or more, respectively, the moisture resistance and the water resistance can be further enhanced, which is preferred. Furthermore, when the XRD peaks corresponding to the (200) and (220) planes of the Mg(Al)O(N) appear at 2θ=43.04° or more and 62.50° or more, respectively, the moisture resistance and the water resistance can be further enhanced, which is more preferred. Moreover, when the XRD peaks corresponding to the (200) and (220) planes of the Mg(Al)O(N) appear at 2θ=43.17° or more and 62.72° or more, respectively, the water resistance can be further enhanced as well as the moisture resistance, which is more preferred. In addition, it was found that a smaller integral breadth of the Mg(Al)O(N) results in higher water resistance. Specifically, the integral breadth of the XRD peak corresponding to the (200) plane of the Mg(Al)O(N) is preferably 0.50° or less and more preferably 0.35° or less in order to improve the water resistance.

If the magnesium oxide solid solution used for the ceramic member of the present invention contains an AlN crystal phase as a subphase, the corrosion resistance tends to decrease. Thus, the magnesium oxide solid solution preferably has a lower AlN crystal phase content. More preferably, the magnesium oxide solid solution is free from the AlN crystal phase.

The magnesium oxide solid solution used for the ceramic member of the present invention may contain a Mg—Al oxynitride phase serving as a subphase, in which the XRD peak of the Mg—Al oxynitride phase measured with CuKα radiation appears at at least 2θ=47 to 49°. The Mg—Al oxynitride also has high corrosion resistance. Thus, if the Mg—Al oxynitride is contained as the subphase, there is no problem. A higher Mg—Al oxynitride phase content improves the mechanical properties and, in particular, effectively affects improvements in strength and fracture toughness. However, magnesium-aluminum oxynitride has low corrosion resistance, compared with the Mg(Al)O(N) of the present invention. Thus, the magnesium-aluminum oxynitride content is restricted in view of corrosion resistance. Upon letting the XRD peak intensity of the Mg—Al oxynitride phase observed at 2θ=47 to 49° be A, and letting the intensity of the XRD peak corresponding to the (220) plane of the Mg(Al)O(N) observed at 2θ=62.3 to 65.2° be B, A/B is preferably 0.03 or more. In this case, the mechanical properties can be further enhanced. From the viewpoint of corrosion resistance, A/B is preferably 0.14 or less.

In the magnesium oxide solid solution used for the ceramic member of the present invention, the molar ratio of Mg/Al in a mixed powder is preferably 0.5 or more.

The ceramic base used for the ceramic member of the present invention preferably has an open porosity of 5% or less. Here, the open porosity is defined as a value measured by Archimedes' method using pure water as a medium. An open porosity exceeding 5% can result in a reduction in strength and can be liable to cause particle emissions by the shedding of the material itself. Furthermore, for example, dust components are liable to be accumulated in the pores at the time of processing of the material, which is not preferred. The open porosity is preferably as close to zero as possible. Thus, the lower limit is not particularly set.

The magnesium oxide solid solution used for the ceramic member of the present invention preferably has a thermal expansion coefficient of 9 ppm/K or more and 14 ppm/K or less and more preferably 10 ppm/K or more and 13 ppm/K or less. The thermal expansion coefficient of the magnesium oxide solid solution depends on the composition ratio of Mg, O, Al and N contained. For example, in the magnesium oxide solid solution, a higher Mg content has a tendency to cause increases in corrosion resistance and thermal expansion coefficient. A lower Mg content has a tendency to cause a slight reduction in corrosion resistance and a reduction in thermal expansion coefficient. When the composition of Mg, O, Al, and N components is set to achieve desired properties, the thermal expansion coefficient is preferably 9 ppm/K or more and 14 ppm/K or less.

The magnesium oxide solid solution used for the ceramic member of the present invention may be produced by, for example, compacting a powder mixture of magnesium oxide, aluminum nitride, and alumina, which are raw materials for the composition, and firing the resulting compact. In view of corrosion resistance, for example, the magnesium oxide solid solution preferably has a magnesium oxide content of 70% by mass or more and 99% by mass or less, an aluminum nitride content of 0.5% by mass or more and 25% by mass or less, and an alumina content of 0.5% by mass or more and 25% by mass or less, and more preferably a magnesium oxide content of 70% by mass or more and 90% by mass or less, an aluminum nitride content of 5% by mass or more and 25% by mass or less, and an alumina content of 5% by mass or more and 25% by mass or less, in terms of magnesium oxide, aluminum nitride, and aluminum oxide (alumina) in the composition of the powder mixture of the raw materials. Furthermore, from the viewpoint of simultaneously achieving mechanical properties and corrosion resistance, the magnesium oxide solid solution preferably has a magnesium oxide content of 49% by mass or more and 99% by mass or less, an aluminum nitride content of 0.5% by mass or more and 25% by mass or less, and an alumina content of 0.5% by mass or more and 30% by mass or less, and more preferably a magnesium oxide content of 50% by mass or more and 75% by mass or less, an aluminum nitride content of 5% by mass or more and 20% by mass or less, and an alumina content of 15% by mass or more and 30% by mass or less, in terms of magnesium oxide, aluminum nitride, and aluminum oxide (alumina) in the composition of the powder mixture of the raw materials.

The electrode used for the ceramic member of the present invention is partially arranged in the ceramic base and contains a ruthenium-aluminum alloy as an electrode component. The ruthenium-aluminum alloy has a low reactivity to the ceramic base containing magnesium oxide, a magnesium oxide solid solution, or zirconium oxide as a main component. In the case of firing (co-firing) with the ceramic base, the diffusion of the electrode component in the ceramic base is more suppressed, which is preferred. The proportion of Ru in the raw materials for the electrode, is preferably more than 20% by mole and 95% by mole or less with respect to the total of Ru and Al. In this range, for example, the occurrence of cracking is inhibited, the resistivity is more reduced, and the diffusion of the electrode material in the base is more suppressed, which are more preferred. The proportion of Ru is preferably 30% by mole or more, more preferably 35% by mole or more, and still more preferably 40% by mole or more with respect to the total of Ru and Al. The proportion of Ru is preferably 80% by mole or less, more preferably 70% by mole or less, and still more preferably 55% by mole or less with respect to the total of Ru and Al. The electrode component in the electrode preferably has a thermal expansion coefficient comparable to the ceramic base and preferably has a thermal expansion coefficient of 9 to 14 ppm/K.

The electrode used for the ceramic member of the present invention may contain RuAl as a crystal phase. The electrode may also contain Ru or $Ru_2Al_3$ as a crystal phase. Regarding the electrode component, for example, in the case where the electrode has a higher Ru content than the Al content, the electrode contains the crystal phase of Ru. In the case where the electrode has a higher Al content than the Ru content, the electrode contains the crystal phase of $Ru_2Al_3$. In view of resistivity, the occurrence of cracking, the diffusion of the electrode components in the base, and so forth, the electrode preferably has lower contents of the crystal phase, e.g., Ru or $Ru_2Al_3$, other than RuAl. More preferably, the electrode does not contain the crystal phase other than RuAl.

In the electrode used for the ceramic member of the present invention, the electrode components may contain a filler component as an additive to adjust the thermal expansion coefficient. Examples of the filler component include a filler component containing Mg, N, and O; and a filler component containing Al, N, and O. In other words, the electrode of the present invention may contain at least one selected from Mg, Zr, Y, Ca, Ce, Al, N, and O as electrode components in addition to the ruthenium-aluminum alloy. Among these, an additive containing Mg and O is more preferred because only a small amount of the additive added can increase the thermal expansion coefficient of the electrode. As the additive, a substance having a larger thermal expansion coefficient than those of the electrode components is preferably used. In this case, the thermal expansion coefficient of the electrode can be adjusted using the filler component with respect to the thermal expansion coefficient of the ceramic base. The reason for this is that the thermal expansion coefficient of the RuAl alloy is often lower than that of the ceramic base containing magnesium oxide. Furthermore, the sintering of the filler component and the ceramic base results in an increase in the adhesion strength between the base and the electrode. Examples of the additive that may be used include, but are not particularly limited to, magnesium oxide; and magnesium oxide solid solution, such as Mg(Al)O(N). In other words, as the additive, the same composition as the ceramic base may be used. Alternatively, a composition different from the ceramic base may be used. To further reduce an increase in the resistance of the electrode, the amount of the filler component added is preferably minimized. For example, the amount of the filler component added is preferably 40% by volume or less and more preferably 20% by volume or less with respect to the total of Ru and Al. Thus, in view of reducing the amount of the filler component added, the RuAl alloy in the electrode component preferably has a thermal expansion coefficient of 9 ppm/K or more and more preferably 10 ppm/K or more.

In the electrode used for the ceramic member of the present invention, the absolute value of a difference in thermal expansion coefficient (thermal expansion coefficient difference) between the ceramic base and the raw material component of the electrode is preferably 2.5 ppm/K or less and more preferably 0.8 ppm/K or less. A thermal expansion coefficient difference of 0.8 ppm/K or less is more likely to suppress the occurrence of cracking in the vicinity of the electrode. The thermal expansion coefficient difference is more preferably 0.6 ppm/K or less and still more preferably 0.4 ppm/K or less. Here, the thermal expansion coefficient of "the raw material component of the electrode" indicates that, for example, in the case where the raw material component of the electrode is the RuAl alloy alone, the thermal expansion coefficient is defined as the thermal expansion coefficient of the RuAl alloy and that in the case where the electrode further contains another electrode component and the filler component, the thermal expansion coefficient is defined as the average value of the thermal expansion coefficients of the RuAl alloy, another electrode component, and the filler component on the basis of volume fractions calculated from an electron microscope image. Specifically, in the case where the raw material component of the electrode contains 50% by volume of RuAl which serves as an electrode component and which has a thermal expansion coefficient of 10.5 ppm/K and 50% by volume of MgO which serves as a filler component and which has a thermal expansion coefficient of 13.0 ppm/K, the average thermal expansion coefficient is calculated as 10.5×0.5+ 13.0×0.5=11.8 ppm/K. In an electrode containing a plurality of electrode components and a filler component, the thermal expansion coefficient is determined using the average thermal expansion coefficient.

The electrode used for the ceramic member of the present invention preferably has a lower resistivity and a resistivity of $1\times10^{-4}$ Ωcm or less. In this case, the electrode may function as an electrode used for an electrostatic chuck or the like. The resistivity is preferably $5.5 \times 10^{-5}$ Ωcm or less, more preferably $3.5 \times 10^{-5}$ Ωcm or less, and still more preferably $2.5 \times 10^{-5}$ Ωcm or less. In this case, the electrode may function as an electrode for a heater or the like.

The electrode used for the ceramic member of the present invention may have, for example, a plate-, net-, linear-, or coil-like shape. The electrode may have a thickness of 1 μm or more or 10 μm or more. The electrode may have a thickness of 200 μm or less or 100 μm or less. The thickness of the electrode may be appropriately determined by the application of the electrode, for example, an electrostatic electrode for an electrostatic chuck or a heater electrode, and the specification of a product.

The electrode used for the ceramic member of the present invention may be formed by the sintering of a ruthenium-aluminum alloy powder as a raw material or by the reaction sintering of a ruthenium powder and an aluminum powder as raw materials. In the case where the ruthenium-aluminum alloy powder is used as a raw material, the resulting electrode has more uniform distributions of Ru and Al. In the case where the ruthenium powder and the aluminum powder are used as raw materials, a step of preparing an alloy powder in advance is omitted, thereby simplifying the process.

A method for producing the ceramic member of the present invention will be described below. The production method of the present invention may include a formation step of forming a green electrode containing Ru and Al on part of a first sintered compact containing at least one of magnesium oxide, a magnesium oxide solid solution in which a predetermined component is dissolved in magnesium oxide, and zirconium oxide, and arranging a second sintered compact or a second green compact (unfired) on the resulting formed article to form a laminate, the second sintered compact or the second green compact (unfired) having the same composition as the first sintered compact; and a firing step of firing the laminate. Here, a method for producing a ceramic member including a ceramic base containing a magnesium oxide solid solution will be mainly described.

In the formation step, preparation treatment, first compacting treatment, and first firing treatment are performed to produce the first sintered compact. The first sintered compact may be produced by, for example, preparing a powder mixture of magnesium oxide, aluminum nitride, and aluminum oxide (alumina), compacting the powder mixture into a first green compact, and firing the first green compact. The powder mixture which is used in the preparation treatment and which is a raw material for the first sintered compact preferably contains 49% by mass or more magnesium oxide, aluminum nitride, and alumina. In view of corrosion resistance, the powder mixture more preferably has a magnesium oxide content of 70% by mass or more and 99% by mass or less, an aluminum nitride content of 0.5% by mass or more and 25% by mass or less, and an alumina content of 0.5% by mass or more and 25% by mass or less in the composition of the powder mixture. Still more preferably, the powder mixture has a magnesium oxide content of 70% by mass or more and 90% by mass or less, an aluminum nitride content of 5% by mass or more and 25% by mass or less, and an alumina content of 5% by mass or more and 25% by mass or less. From the viewpoint of simultaneously achieving mechanical properties and corrosion resistance, the powder mixture more preferably has a magnesium oxide content of 49% by mass or more and 99% by mass or less, an aluminum nitride content of 0.5% by mass or more and 25% by mass or less, and an alumina content of 0.5% by mass or more and 30% by mass or less in the composition of the powder mixture. Still more preferably, the powder mixture has a magnesium oxide content of 50% by mass or more and 75% by mass or less, an aluminum nitride content of 5% by mass or more and 20% by mass or less, and an alumina content of 15% by mass or more and 30% by mass or less. The same composition of the raw material powder is used for the second green compact or the second sintered compact of the magnesium oxide solid solution. In the first compacting treatment, for example, the powder mixture is subjected to uniaxial compaction treatment with a metal mold capable of forming a predetermined shape. The compacting pressure is appropriately determined, depending on the application and specifications and may be, for example, 50 kgf/cm$^2$ or more and 200 kgf/cm$^2$ or less.

Next, the first firing treatment to fire the first green compact is performed to provide the first sintered compact. In the firing of the first green compact, in the cases of magnesium oxide and the magnesium oxide solid solution, for example, the firing temperature is preferably 1650° C. or higher and more preferably 1700° C. or higher. A firing temperature of 1650° C. or higher ensures the strength of the first sintered compact, thereby more assuredly producing the target Mg(Al)O(N). At a firing temperature of lower than 1700° C., the ceramic base contains AlN as a subphase, in some cases. To achieve high corrosion resistance, firing is preferably performed at 1700° C. or higher. The firing temperature is not particularly limited and may be, for example, 1850° C. or lower. As the firing, hot-press firing is preferably employed. The hot-press firing is preferably performed at a pressing pressure of 50 to 300 kgf/cm$^2$. An atmosphere during firing is preferably an atmosphere that does not affect the firing of the oxide raw material. Preferred examples thereof include a nitrogen atmosphere and inert atmospheres, such as an Ar atmosphere and a He atmosphere. The pressure during the compacting is not particularly limited and may be appropriately set to a pressure such that the shape is maintained.

For the ceramic base containing zirconium oxide, for example, the firing temperature is preferably 1100° C. or higher and more preferably 1300° C. or higher. A firing temperature of 1300° C. or higher ensures the strength of the first sintered compact. The firing temperature is not particularly limited and may be, for example, 1800° C. or lower. An atmosphere during firing is preferably an atmosphere that does not affect the firing of the oxide raw material. Preferred examples thereof include a nitrogen atmosphere and inert atmospheres, such as an Ar atmosphere and a He atmosphere. The pressure during the compacting is not particularly limited and may be appropriately set to a pressure such that the shape is maintained.

Subsequently, the first sintered compact is subjected to electrode formation treatment to form the green electrode. The green electrode may be formed by, for example, preparing a slurry or paste in which an electrode raw-material powder containing an electrode component and optionally a filler component are dispersed in a solvent (hereinafter, referred to simply as a "paste") and by using the paste. A material for the electrode may be a ruthenium-aluminum alloy powder or a ruthenium powder and an aluminum powder. In the case here the ruthenium-aluminum alloy powder is used as a raw material, the resulting electrode has more uniform distributions of Ru and Al. In the case where the ruthenium powder and the aluminum powder are used as raw materials, a step of preparing an alloy powder in advance is omitted, thereby simplifying the process. In the electrode material, the proportion of Ru is preferably more than 20% by mole and 95% by mole or less with respect to the total of Ru and Al. In this range, for example, the occurrence of cracking is inhibited, the resistivity is more reduced, and the diffusion of the electrode material in the base is more suppressed, which are more preferred. The proportion of Ru is preferably 30% by mole or more, more preferably 35% by mole or more, and still more preferably 40% by mole or more with respect to the total of Ru and Al. The proportion of Ru is preferably 80% by mole or less, more preferably 70% by mole or less, and still more preferably 55% by mole or less with respect to the total of Ru and Al. The electrode material preferably has a particle size of 0.1 to 50 μm, which achieves both the flowability and the shape retentivity of the paste. As a solvent used for the paste, a solvent that does not cause the degradation of the function of the ceramic member in the subsequent step is preferred. For example, an organic solvent, such as diethylene glycol monobutyl ether, is preferred. The electrode paste may further contain, for example, a binder in addition to the solvent. As the binder, for example, an organic binder, such as polyvinyl butyral, is preferably used. The formation of the electrode may be performed by, for example, screen printing.

The electrode component in the electrode preferably has a thermal expansion coefficient comparable to the ceramic base. A filler component to adjust the thermal expansion coefficient is preferably added thereto. An example of the filler component is a filler component containing Mg and O. An additive containing Mg and O is more preferred because only a small amount of the additive added can increase the thermal expansion coefficient of the electrode. As the filler component, a substance having a larger thermal expansion coefficient than that of the electrode component is preferably used. In this case, the addition of the filler component enables the adjustment of the thermal expansion coefficient of the electrode with respect to the thermal expansion coefficient of the ceramic base. The reason for this is that the thermal expansion coefficient of the RuAl alloy is often lower than that of the ceramic base containing magnesium oxide. Furthermore, the sintering of the filler component and the ceramic base results in an increase in the adhesion strength between the base and the electrode. Examples of the filler that may be used include, but are not particularly limited to, magnesium oxide; and magnesium oxide solid solution, such as Mg(Al)O(N). In other words, as the additive, the same composition as the ceramic base may be used. Alternatively, a composition different from the ceramic base may be used. To further reduce an increase in the resistance of the electrode, the amount of the filler component added is preferably minimized. For example, the amount of the filler component added is preferably 40% by volume or less and more preferably 20% by volume or less with respect to the total of Ru and Al.

Subsequently, in order to embed the green electrode, the second sintered compact or the second green compact (unfired) having the same cc position as the first sintered compact is arranged on the first sintered compact on which the green electrode has been formed, thereby forming a laminate (lamination treatment). The second sintered compact may be formed in the same step as the first sintered compact. The second green compact may be formed using the raw materials for the first sintered compact. In the case where the second green compact is used, the laminate may be formed by placing the raw material powder for the second green compact an the green electrode arranged on the first sintered compact and applying a predetermined load by the use of uniaxial pressing. The uniaxial pressing in the lamination treatment may be performed under the same conditions as the first compacting treatment.

In the firing step, the resulting laminate is fired. The same firing conditions as the first firing treatment may be used. For example, in the ceramic base having both upper and lower portions produced at 1700° C. or higher and containing magnesium oxide and the magnesium oxide solid solution, in the case of using the first and second sintered compacts, the sintered compacts are bonded together at 1650° C. or higher. For the ceramic base containing zirconium oxide, in the case of using the first and second sintered compacts, the sintered compacts are bonded together at 1400° C. or higher. As the firing, hot-press firing is preferably employed.

The ceramic member of the present invention is produced through the production process. Examples of a member for semiconductor manufacturing equipment provided with the ceramic member of the present invention include electrostatic chucks, susceptors, and heaters used for semiconductor manufacturing equipment. These components are required to have excellent corrosion resistance to plasmas of halogen element-containing corrosive gases. Thus, the ceramic member of the present invention is preferably used therefor.

The ceramic member according to the foregoing embodiment is provided with an electrode having improved properties, such as the inhibition of the occurrence of cracking, a further reduction in resistivity, and the further suppression of the distribution of an electrode material in the base. The reason for this is as follows: For example, the ruthenium-aluminum alloy has a relatively high melting point owing to Ru, a relatively high thermal expansion coefficient owing to Al, and a low reactivity to the ceramic base, even in an alloy state. The ruthenium-aluminum alloy does not contain a magnetic element and thus does not have an effect, such as non-uniform etching, due to the presence of the magnetic element at the time of the application of a voltage in plasma etching or the like, which is preferred. By adjusting a Ru/Al ratio, the thermal expansion coefficient can be adjusted to a value close to those of magnesium oxide and zirconium oxide. In the case where a solid solution containing Mg(Al)O(N) in which Al and N are dissolved in magnesium oxide is used as the ceramic base, the Mg(Al)O(N) serving as the main phase of the solid solution, the resulting ceramic base has corrosion resistance comparable to magnesium oxide and superior moisture resistance and water resistance to magnesium oxide and is more chemically stable.

The present invention is not limited to the foregoing embodiment. It will be obvious that various changes may be made without departing from the technical scope of the invention.

For example, in the foregoing embodiment, the member 20 for semiconductor manufacturing equipment is provided. However, the ceramic member 30 including the ceramic base 32 and the electrode 34 may be provided. In this case, the ceramic member 30 also includes the more suitable electrode and is chemically more stable. In the foregoing embodiment, the member including one electrode has been described. However, the member may include an electrostatic electrode and a heater electrode.

While the ceramic member 30 is used for semiconductor manufacturing equipment in the foregoing embodiment, the ceramic member 30 is not particularly limited thereto. The ceramic member 30 may be used for applications other than semiconductor manufacturing equipment, for example, sensors to detect oxygen and nitrogen oxides, and ceramic heaters.

In the production process described in the foregoing embodiment, the electrode is formed so as to be embedded in the ceramic base. However, the electrode is not particularly limited thereto. For example, the electrode may be formed on the outer surface of the ceramic base. In the foregoing embodiment, the green electrode is formed on the first sintered compact. However, for example, the green electrode may be formed on a surface of the unfired first green compact that is formed by compacting a ceramic raw material. The second green compact (unfired) or the second sintered compact may be arranged on the first green compact (unfired) on which the electrode has been formed to provide a laminate, and then the resulting laminate may be fired to form an embedded electrode member. While the green electrode is formed and then the electrode is sintered in the ceramic base, a sintered electrode that has been produced by performing compacting and firing may be used. In the production process described in the foregoing embodiment, the ceramic base is composed of the magnesium oxide solid solution in which Al and N are dissolved. However, the ceramic base is not limited thereto. For example, the ceramic base may be composed of magnesium oxide or zirconium oxide. Alternatively, the ceramic base may be composed of a magnesium oxide solid solution in which another component is dissolved.

In the foregoing embodiment, the ceramic base containing a relatively large amount of magnesium oxide or zirconium oxide has been described. However, the ceramic base is not particularly limited thereto. The ceramic base may contain a relatively small amount of magnesium oxide. For example, the ceramic base may have a magnesium oxide content of 15% by mass or more and 66.2% by mass or less, an alumina content of 63% by mass or less, and an aluminum nitride content of 57.7% by mass or less, in terms of magnesium oxide, aluminum nitride, and aluminum oxide (alumina) in the composition of the powder mixture of the raw materials. In this case, the ceramic base has corrosion resistance comparable to or higher than that of spinel. Furthermore, the ceramic base may have a magnesium oxide content of 37% by mass or more and 66.2% by mass or less, an alumina content of 63% by mass or less, and an aluminum nitride content of 57.7% by mass or less. Moreover, the ceramic base may have a magnesium oxide content of 5% by mass or more and 60% by mass or less, an alumina content of 60% by mass or less, and an aluminum nitride content of 90% by mass or less. In this case, the ceramic base has a lower linear thermal expansion coefficient and higher temperature uniformity while having corrosion resistance comparable to that of spinel. These ceramic bases are also provided with electrodes having improved properties.

In the foregoing case, the ceramic base may contain magnesium, aluminum, oxygen, and nitrogen as main components and the Mg—Al oxynitride phase as a main phase, in which the XRD peak of the Mg—Al oxynitride phase measured with CuKα radiation appears at at least $2\theta=47$ to $49°$. The corrosion resistance of the Mg—Al oxynitride to halogen-based plasmas is comparable to or higher than that of spinel. Thus, the ceramic base containing the oxynitride as the main phase also has high corrosion resistance. The Mg—Al oxynitride may have a lower linear thermal expansion coefficient than that of spinel while having corrosion resistance comparable to that of spinel. In this case, the ceramic base may contain the crystal phase of Mg(Al)O(N) in which Al and N components are dissolved in magnesium oxide, the crystal phase serving as a subphase. The Mg(Al)O(N) also has high corrosion resistance. Thus, if the Mg(Al)O(N) is contained as the subphase, there is no problem.

EXAMPLES

Preferred application examples of the present invention will be described below. Results of detailed studies on ceramic bases containing magnesium oxide or magnesium oxide solid solutions in which predetermined components (Al and N) are dissolved in magnesium oxide are described in Experimental Examples 1 to 26. In Experimental Examples 1 to 16 and 22 to 26, as raw material MgO and raw material $Al_2O_3$, commercial items each having a purity of 99.9% by mass or more and an average particle size of 1 μm or less were used, and as raw material AlN, a commercial item having a purity of 99% by mass and an average particle size of 1 μm or less was used. In Experimental Examples 17 to 21, as raw material MgO, a commercial item having a purity of 99.4% by mass and an average particle size of 3 μm was used. As raw material $Al_2O_3$, a commercial item having a purity of 99.9% by mass and an average particle size of 0.5 μm was used. As raw material AlN, the commercial item, which was the same as in Experimental Examples 1 to 16 and 22 to 26, having an average particle size of 1 μm or less was used.

Experimental Examples 1 to 16 and 24

Preparation

Raw material MgO, raw material $Al_2O$ and raw material AlN were weighed in amounts (% by mass) described in Table 1. These materials were wet-mixed for 4 hours in a nylon pot with alumina balls 5 mm in diameter using isopropyl alcohol as a solvent. After the completion of the mixing, the resulting slurry was taken out and dried at 110° C. in a stream of nitrogen. Then the mixture was passed through a 30-mesh sieve to provide a powder mixture. The molar ratio of Mg/Al of the powder mixture was 2.9.

Compacting

The powder mixture was subjected to uniaxial pressing at 200 $kgf/cm^2$ to form a disk-like green compact having a diameter of about 50 mm and a thickness of about 20 mm. The green compact was placed in a graphite mold for firing.

Firing

The disk-like green compact was subjected to hot-press firing to provide a ceramic base. The hot-press firing was performed at a pressing pressure of 200 $kgf/cm^2$ and a firing temperature (maximum temperature) described in Table 1. An Ar atmosphere was maintained until the firing was completed. The holding time at the firing temperature was 4 hours.

Experimental Examples 17 to 23, 25, and 26

Ceramic bases were produced as in Experimental Example 1, except that raw material MgO, raw material $Al_2O_3$, and raw material AlN were weighed in amounts (% by mass) described in Table 1, the compacting pressure applied to the powder mixture was 100 $kgf/cm^2$, the atmosphere during the firing was $N_2$, and the firing temperature (maximum temperature) was a value described in Table 1.

Evaluation

Each of the materials produced in Experimental Examples 1 to 26 was processed for various evaluations, and the following evaluations were made. Tables 1 and 2 illustrate the evaluation results.

(1) Bulk Density and Open Porosity

The bulk density and the open porosity were measured by Archimedes' method using pure water as a medium.

(2) Evaluation of Crystal Phase

Each of the materials was pulverized with a mortar. The crystal phase was identified with an X-ray diffractometer. The measurement was performed with a sealed tube-type X-ray diffractometer (D8 ADVANCE, manufactured by Bruker AXS) operating at 40 kV and 40 mA and using CuKα radiation in the range of 2θ between 50 and 70° with a step size of 0.02°. In the case where diffraction angles at positions of the peak maxima were determined, 10% by mass of a standard Si sample powder (SRM 640C) manufactured by NIST was added as an internal standard to correct peak positions. The diffraction angles at the positions of the peak maxima of magnesium oxide were defined as values reported in ICDD No. 78-0430. The peak spacing and the integral breadth between the solid solution (Mg(Al)O(N)) in which Al and N components were dissolved in magnesium oxide and magnesium oxide were calculated as described below.

(2)-1 Calculation of Peak Spacing (Peak Shift)

To perform the relative comparison of the solid solubility of Al and N in the Mg(Al)O(N), the peak spacing (peak shift) was evaluated with reference to the (220) plane of the Mg(Al)O(N). The difference between the diffraction angle at the position of the peak maximum corresponding to the (220) plane of the Mg(Al)O(N) and the diffraction angle (62.3°) of the (220) plane of magnesium oxide reported in No. 78-0430 was defined as the peak spacing.

(2)-2 Calculation of Integral Breadth

To perform the relative comparison of the crystallinity of the Mg(Al)O(N), the integral breadth was calculated. The integral breadth was calculated by dividing the peak area of the (200) peak of the MgO—AlN solid solution by the intensity of the peak maximum (Imax). The peak area was obtained by cancelling the background and integrating the intensity in the range of −1° to +1° of the diffraction angle at the position of the peak maximum. The calculation formula is described below. The background was defined as a peak intensity at an angle obtained by subtracting 1° from the diffraction angle at the position of the peak maximum. The integral breadth of the (111) plane of the standard Si sample (SRM 640C) manufactured by NIST was calculated by the method and found to be 0.15°.

(Integral Breadth)=($\Sigma I(2\theta) \times$(step size))/$I$max (2)-3 Calculation of XRD Peak Intensity Ratio of Mg—Al Oxynitride Phase and Mg(Al)O(N)

To perform the relative comparison of the proportion of the Mg—Al oxynitride phase contained as a subphase, the XRD peak intensity ratio of the Mg—Al oxynitride phase to the Mg(Al)O(N) was calculated by a method described below. Upon letting the XRD peak intensity of the Mg—Al oxynitride phase observed at 2θ=47 to 49° be A, and letting the intensity of the XRD peak corresponding to the (220) plane of the Mg(Al)O(N) observed at 2θ=62.3 to 65.2° be B, the value of A/B was determined. Here, the XRD peak intensity A was defined as an integrated intensity obtained by cancelling the background of the XRD peak observed at 2θ=47 to 49°. The XRD peak intensity B was defined as an integrated intensity obtained by cancelling the background of the XRD peak corresponding to the (220) plane of the Mg(Al)O(N). The calculation was performed with commercially available software JADE 5 manufactured by MDI.

(3) Etching Rate

A surface of each of the materials was mirror-polished. A corrosion resistance test was performed with an ICP corrosion resistance testing apparatus under conditions described below. The step height between a masked surface and an exposed surface measured with a surface profiler was divided by a testing time to calculate the etching rate of each material.

ICP: 800 W, bias: 450 W, introduction gas: $NF_3/O_2/Ar$=75/35/100 sccm at 0.05 Torr, exposure time: 10 h, sample temperature: room temperature.

(4) Constituent Elements

The detection, identification, and concentrations of constituent elements were analyzed by EPMA.

(5) Moisture Resistance

Each of the materials was pulverized with a mortar to prepare a powder having a median diameter of 10 μm or less. The powder was exposed to an atmosphere with a saturated water vapor pressure at room temperature for 4 days. Then the amount of dehydration was measured with a TG-DTA in the temperature range of 40° C. to 500° C.

(6) Moisture Resistance of Bulk Material

A surface of each of the materials was mirror-polished. The mirror-polished materials were exposed to an atmosphere having a temperature of 40° C. and a relative humidity of 90% for 28 days. Then the surface of each material was observed with a scanning electron microscope (XL30, manufactured by Philips). A material that remained unchanged was rated as (◯). A material in which acicular or granular precipitates were formed on 40% or more of the surface was rated as (x). A material in an intermediate state therebetween was rated as (Δ).

(7) Water Resistance of Bulk Material

A surface of each of the materials was mirror-polished. The mirror-polished materials were immersed in water at room temperature for 15 days. Then the surface of each material was observed with the scanning electron microscope. A material that remained unchanged was rated as (◯). A material in which the trace of elution was observed on 40% or more of the surface was rated as (x). A material in an intermediate state therebetween was rated as (Δ).

(8) Fracture Toughness

The fracture toughness was evaluated by an SEPB method according to JIS-R1607.

(9) Bending Strength

The bending strength was measured by a bending strength test according to JIS-R1601.

(10) Measurement of Volume Resistivity

The volume resistivity was measured by a method according to JIS-C2141 in air at room temperature. A test piece had a size of 50 mm×(0.5 to 1 mm). Electrodes composed of silver were formed in such a manner that a main electrode had a diameter of 20 mm, a guard electrode had an inside diameter of 30 mm and an outside diameter of 40 mm, and an application electrode had a diameter of 40 mm. The applied voltage was 2 kV/mm. A current value one minute after the application the voltage was read. The volume resistivity at room temperature was calculated from the current value. In each of Experimental Examples 1, 3, 5, and 12, the volume resistivity was measured by the same method in vacuum (0.01 Pa or less) at 600° C. A test piece had a size of 50 mm×(0.5 to 1 mm). Electrodes composed of silver were formed in such a manner that a main electrode had a diameter of 20 mm, a guard electrode had an inside diameter of 30 mm and an outside diameter of 40 mm, and an application electrode had a diameter of 40 mm. The applied voltage was 500 V/mm. A current value one hour after the application the voltage was read. The volume resistivity at room temperature was calculated from the current value. In the volume resistivity described in Table 2, "aEb" represents a×$10^b$. For example, "1E16" represents 1×$10^{16}$.

TABLE 1

| Composition | MgO mass % | Al$_2$O$_3$ mass % | AlN mass % | Mg/Al Molar Ratio | Firing Temperature °C. | Firing Atmosphere | Bulk Density g/cm$^2$ | Open Porosity % |
|---|---|---|---|---|---|---|---|---|
| EXAMPLE 1 | 70.7 | 22.0 | 7.2 | 2.9 | 1850 | Ar | 3.53 | 0.15 |
| EXAMPLE 2 | 70.7 | 22.0 | 7.2 | 2.9 | 1800 | Ar | 3.54 | 0.04 |
| EXAMPLE 3 | 70.7 | 22.0 | 7.2 | 2.9 | 1750 | Ar | 3.54 | 0.04 |
| EXAMPLE 4 | 70.7 | 22.0 | 7.2 | 2.9 | 1650 | Ar | 3.53 | 0.10 |
| EXAMPLE 5 | 100 | — | — | — | 1500 | Ar | 3.57 | 0.30 |
| EXAMPLE 6 | 37.0 | 63.0 | — | 0.7 | 1650 | Ar | 3.57 | 0.00 |
| EXAMPLE 7 | 60.7 | 29.6 | 9.7 | 1.9 | 1850 | Ar | 3.52 | 0.05 |
| EXAMPLE 8 | 60.7 | 29.6 | 9.7 | 1.9 | 1800 | Ar | 3.52 | 0.05 |
| EXAMPLE 9 | 60.7 | 29.6 | 9.7 | 1.9 | 1750 | Ar | 3.52 | 0.05 |
| EXAMPLE 10 | 61.2 | 25.2 | 13.5 | 1.9 | 1800 | Ar | 3.49 | 0.02 |
| EXAMPLE 11 | 66.2 | 24.1 | 9.7 | 2.3 | 1800 | Ar | 3.52 | 0.01 |
| EXAMPLE 12 | 71.2 | 18.8 | 10.1 | 2.9 | 1800 | Ar | 3.52 | 0.03 |
| EXAMPLE 13 | 56.1 | 28.6 | 15.3 | 1.5 | 1800 | Ar | 3.47 | 0.05 |
| EXAMPLE 14 | 85.0 | 11.3 | 3.7 | 10.6 | 1800 | Ar | 3.55 | 0.07 |
| EXAMPLE 15 | 72.6 | 9.3 | 18.2 | 2.9 | 1800 | Ar | 3.46 | 0.00 |
| EXAMPLE 16 | 74.0 | 24.7 | 1.3 | 3.6 | 1800 | Ar | 3.56 | 0.19 |
| EXAMPLE 17 | 49.0 | 28.2 | 22.8 | 1.1 | 1775 | N$_2$ | 3.41 | 0.00 |
| EXAMPLE 18 | 70.7 | 22.0 | 7.2 | 2.9 | 1800 | N$_2$ | 3.53 | 0.05 |
| EXAMPLE 19 | 60.7 | 29.6 | 9.7 | 1.9 | 1800 | N$_2$ | 3.54 | 0.07 |
| EXAMPLE 20 | 41.0 | 38.4 | 20.6 | 0.8 | 1800 | N$_2$ | 3.43 | 0.04 |
| EXAMPLE 21 | 60.7 | 29.6 | 9.7 | 1.9 | 1725 | N$_2$ | 3.52 | 0.06 |
| EXAMPLE 22 | 60.7 | 29.6 | 9.7 | 1.9 | 1900 | N$_2$ | 3.52 | 0.05 |
| EXAMPLE 23 | 60.7 | 29.6 | 9.7 | 1.9 | 1775 | N$_2$ | 3.52 | 0.05 |
| EXAMPLE 24 | 60.7 | 29.6 | 9.7 | 1.9 | 1775 | Ar | 3.52 | 0.05 |
| EXAMPLE 25 | 60.7 | 29.6 | 9.7 | 1.9 | 1700 | N$_2$ | 3.52 | 0.06 |
| EXAMPLE 26 | 60.7 | 29.6 | 9.7 | 1.9 | 1650 | N$_2$ | 3.53 | 0.09 |

| Composition | Crystal Phase Main Phase[1] | Crystal Phase Subphase[2] | Mg(Al)O(N) Peak Maxima (111) Plane (°) | Mg(Al)O(N) Peak Maxima (200) Plane (°) | Mg(Al)O(N) Peak Maxima (220) Plane (°) | (220) Plane Peak Shift[3] (°) | (200) Plane Integral Breadth[4] (°) |
|---|---|---|---|---|---|---|---|
| EXAMPLE 1 | Mg(Al)O(N) | MgAl$_2$O$_4$Mg—Al—O—N | 37.22 | 43.26 | 62.85 | 0.55 | 0.26 |
| EXAMPLE 2 | Mg(Al)O(N) | MgAl$_2$O$_4$Mg—Al—O—N | 37.14 | 43.18 | 62.73 | 0.43 | 0.25 |
| EXAMPLE 3 | Mg(Al)O(N) | MgAl$_2$O$_4$Mg—Al—O—N | 36.96 | 43.16 | 62.75 | 0.45 | 0.45 |
| EXAMPLE 4 | Mg(Al)O(N) | MgAl$_2$O$_4$AlN | 36.94 | 42.92 | 62.33 | 0.03 | 0.34 |
| EXAMPLE 5 | MgO | — | 38.90 | 42.90 | 62.30 | 0.00 | 0.28 |
| EXAMPLE 6 | MgAl$_2$O$_4$ | MgO | — | 42.90 | 62.30 | 0.00 | 0.27 |
| EXAMPLE 7 | Mg(Al)O(N) | MgAl$_2$O$_4$Mg—Al—O—N | — | 43.18 | 62.73 | 0.43 | 0.26 |
| EXAMPLE 8 | Mg(Al)O(N) | MgAl$_2$O$_4$Mg—Al—O—N | — | 43.18 | 62.73 | 0.43 | 0.32 |
| EXAMPLE 9 | Mg(Al)O(N) | MgAl$_2$O$_4$Mg—Al—O—N | — | 43.04 | 62.65 | 0.35 | 0.49 |
| EXAMPLE 10 | Mg(Al)O(N) | MgAl$_2$O$_4$Mg—Al—O—N | — | 43.20 | 62.75 | 0.45 | 0.31 |
| EXAMPLE 11 | Mg(Al)O(N) | MgAl$_2$O$_4$Mg—Al—O—N | — | 43.20 | 62.75 | 0.45 | 0.28 |
| EXAMPLE 12 | Mg(Al)O(N) | Mg—Al—O—N | 37.24 | 43.26 | 62.83 | 0.53 | 0.30 |
| EXAMPLE 13 | Mg(Al)O(N) | MgAl$_2$O$_4$—Al—O—N | — | 43.18 | 62.73 | 0.43 | 0.30 |
| EXAMPLE 14 | Mg(Al)O(N) | MgAl$_2$O$_4$Mg—Al—O—N | 37.06 | 43.08 | 62.53 | 0.23 | 0.25 |
| EXAMPLE 15 | Mg(Al)O(N) | Mg—Al—O—N | 36.98 | 42.98 | 62.41 | 0.11 | 0.27 |
| EXAMPLE 16 | Mg(Al)O(N) | MgAl$_2$O$_4$ | — | 42.94 | 62.37 | 0.07 | 0.25 |
| EXAMPLE 17 | Mg(Al)O(N) | MgAl$_2$O$_4$Mg—Al—O—N | — | 43.18 | 62.72 | 0.42 | 0.35 |
| EXAMPLE 18 | MgO | MgAl$_2$O$_4$AlN | 36.9 | 42.90 | 62.30 | 0.00 | 0.31 |
| EXAMPLE 19 | MgO | MgAl$_2$O$_4$AlN | — | 42.90 | 62.30 | 0.00 | 0.30 |
| EXAMPLE 20 | MgAl$_2$O$_4$Mg—Al—O—NMg(Al)O(N) | | — | 43.17 | 62.72 | 0.42 | 0.27 |
| EXAMPLE 21 | Mg(Al)O(N) | MgAl$_2$O$_4$Mg—Al—O—N | — | 43.02 | 62.63 | 0.33 | 0.51 |
| EXAMPLE 22 | Mg(Al)O(N) | MgAl$_2$O$_4$Mg—Al—O—N | — | 43.18 | 62.73 | 0.43 | 0.26 |
| EXAMPLE 23 | Mg(Al)O(N) | MgAl$_2$O$_4$Mg—Al—O—N | — | 43.17 | 62.73 | 0.43 | 0.30 |
| EXAMPLE 24 | Mg(Al)O(N) | MgAl$_2$O$_4$Mg—Al—O—N | — | 43.17 | 62.73 | 0.43 | 0.30 |
| EXAMPLE 25 | Mg(Al)O(N) | MgAl$_2$O$_4$Mg—Al—O—N | — | 43.10 | 62.69 | 0.39 | 0.53 |
| EXAMPLE 26 | Mg(Al)O(N) | MgAl$_2$O$_4$AlN | — | 42.92 | 62.33 | 0.06 | 0.34 |

[1] Mg(Al)O(N): MgO—AlN solid solution (cubic)
[2] Mg—Al—O—N: Mg—Al oxynitride
[3] XRD peak spacing of (220) plane of Mg(Al)O(N) and (220) plane of MgO
[4] Integral breadth of (200) plane of Mg(Al)O(N)

TABLE 2

| Composition | XRD Peak A/B[1] | Etching Rate (nm/h) | Rate of Water Loss (%) | Moisture Resistance of Bulk Material[2] | Water Resistance of Bulk Material[3] | Fracture Toughness MPa·m$^{1/2}$ | Strength (MPa) | Volume Resistivity (Ω·cm) | Volume Resistivity at 600° C. (Ω·cm) |
|---|---|---|---|---|---|---|---|---|---|
| EXAMPLE 1 | 0.004 | 109 | 1.8 | ○ | ○ | — | 85 | — | 8E9 |
| EXAMPLE 2 | 0.004 | 112 | 1.9 | ○ | ○ | 2.2 | 145 | >1E17 | — |
| EXAMPLE 3 | 0.003 | 110 | 1.9 | ○ | Δ | 2 | 171 | >1E17 | 3E10 |
| EXAMPLE 4 | 0.000 | 168 | 2.2 | Δ | X | — | 275 | — | — |
| EXAMPLE 5 | 0.000 | 104 | 6.5 | X | X | 2.2 | 240 | >1E17 | 2E12 |
| EXAMPLE 6 | 0.000 | 202 | 2.7 | X | X | — | — | — | — |
| EXAMPLE 7 | 0.058 | 142 | 1.6 | ○ | ○ | 2.6 | 204 | — | — |
| EXAMPLE 8 | 0.039 | 146 | 1.7 | ○ | ○ | 2.5 | 222 | >1E17 | — |
| EXAMPLE 9 | 0.052 | 147 | 1.9 | ○ | Δ | 2.5 | 243 | — | — |
| EXAMPLE 10 | 0.074 | 138 | 1.8 | ○ | ○ | 2.7 | 204 | >1E17 | — |
| EXAMPLE 11 | 0.031 | 143 | 1.8 | ○ | ○ | 2.5 | 183 | — | — |
| EXAMPLE 12 | 0.023 | 93 | 1.4 | ○ | ○ | 1.9 | 152 | — | 2E10 |
| EXAMPLE 13 | 0.138 | 166 | 1.9 | ○ | ○ | 3.1 | 251 | — | — |
| EXAMPLE 14 | 0.005 | 105 | 2.2 | ○ | Δ | 2.1 | 177 | — | — |
| EXAMPLE 15 | 0.125 | 124 | 2.3 | Δ | Δ | 4.4 | 350 | >1E17 | — |
| EXAMPLE 16 | 0.000 | 104 | 2.3 | Δ | X | 2.2 | 185 | — | — |
| EXAMPLE 17 | 0.321 | 181 | 1.8 | ○ | ○ | 3.2 | 270 | — | — |
| EXAMPLE 18 | 0.000 | 171 | 3.6 | X | X | — | — | — | — |
| EXAMPLE 19 | 0.000 | 175 | 3.4 | X | X | — | — | — | — |
| EXAMPLE 20 | 0.449 | 201 | 1.9 | ○ | ○ | 3.3 | 275 | — | — |
| EXAMPLE 21 | 0.058 | 154 | 1.9 | ○ | X | 2.6 | 249 | — | — |
| EXAMPLE 22 | 0.063 | 135 | 1.6 | ○ | ○ | 1.3 | 121 | — | — |
| EXAMPLE 23 | 0.046 | 141 | 1.7 | ○ | ○ | 2.5 | 231 | >1E17 | — |
| EXAMPLE 24 | 0.047 | 136 | 1.7 | ○ | ○ | 2.5 | 236 | >1E17 | — |
| EXAMPLE 25 | 0.051 | 150 | 1.9 | ○ | X | 2.5 | 222 | — | — |
| EXAMPLE 26 | 0.032 | 195 | 2.9 | Δ | X | — | — | — | — |

[1]A: Peak intensity Mg—Al—O—N at 2θ = 47~49°, B: Peak intensity of MgO at 2θ = 62.3~65.2°
[2]Evaluated based on the microstructural change of mirror-polished material before and after being exposed to an atmosphere having a temperature of 40° C. and 90RH % moisture for 28 days. A material that remained unchanged was rated as (○), a material in which acicular or granular precipitates were formed on 40% or more of the surface was rated as (X), and a material in an intermediate state there between was rated as (Δ).
[3]Evaluated based on the microstructural change of mirror-polished material before and after being immersed in water at room temperature for 15 days. A material that remained unchanged was rated as (○), a material in which the trace of elution was observed on 40% or more of the surface was rated as (X), and a material in an intermediate state there between was rated as (Δ).
4) "—" represents "unmeasured"

Evaluation Results

Figure 3:
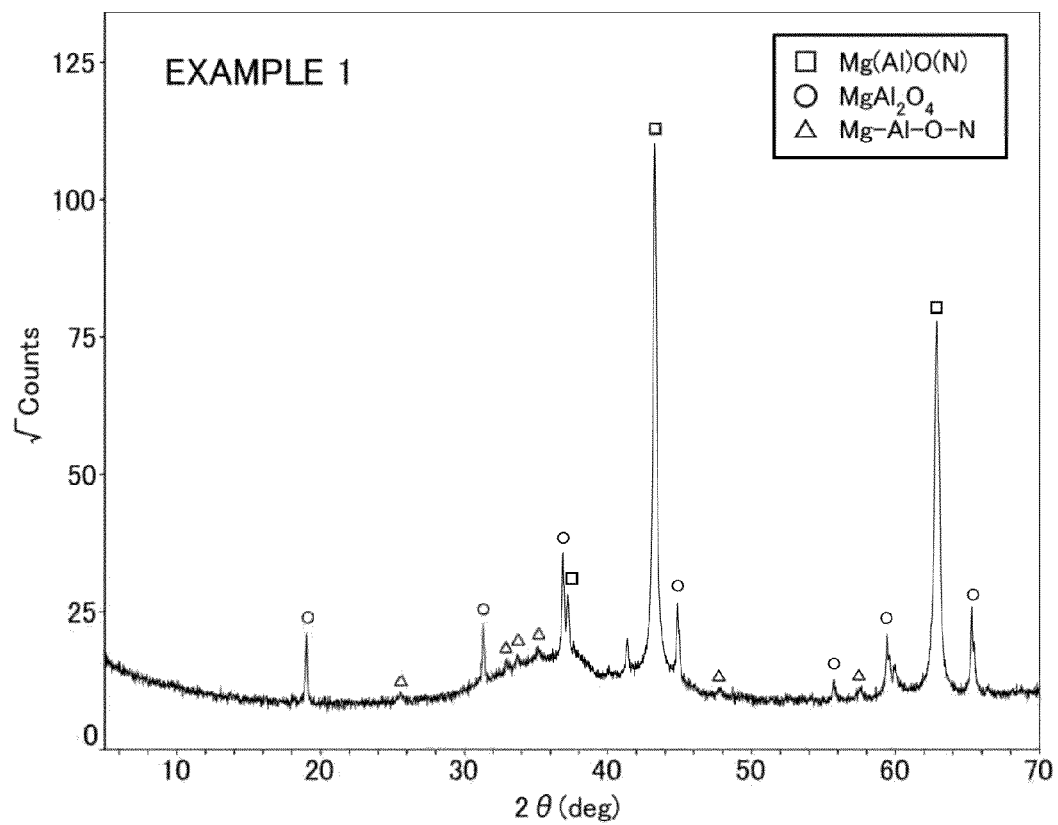
FIG. 3 is an XRD analysis chart in Experimental Example 1.
Figure 4:
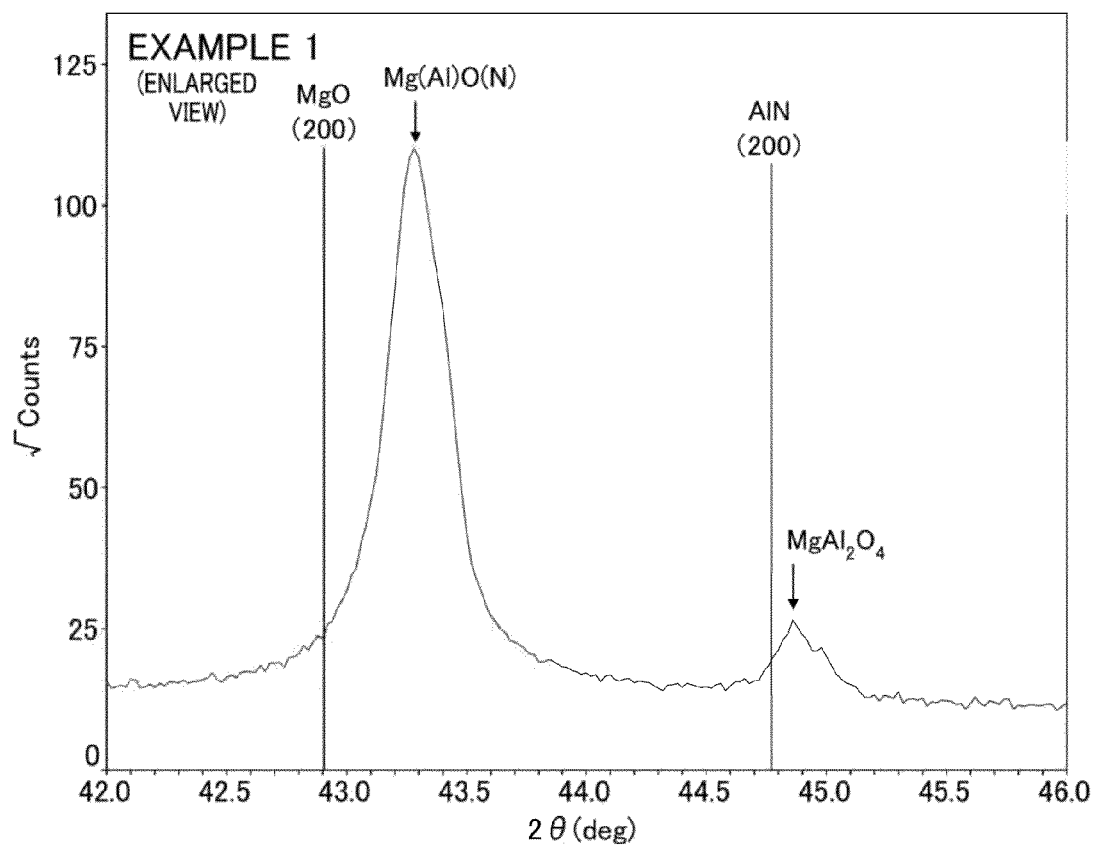
FIG. 4 is an enlarged view of a Mg(Al)O(N) peak in the XRD analysis chart in Experimental Example 1.
Figure 5:
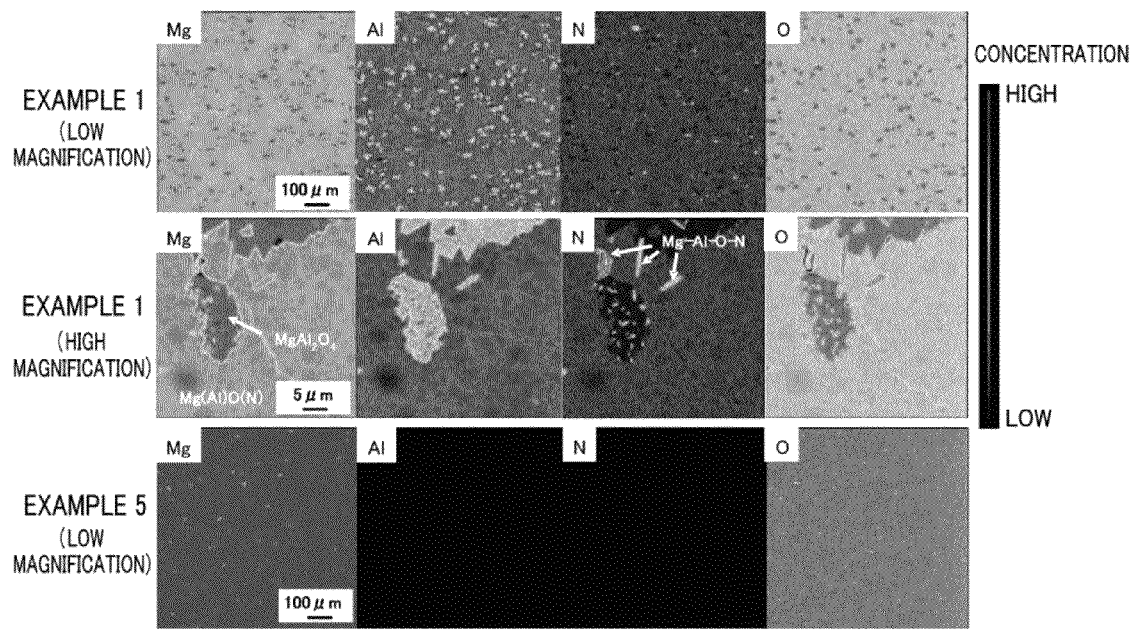
FIG. 5 illustrates element mapping images in Experimental Examples 1 and 5 by EPMA.

As illustrated in Tables 1 and 2, in each of Experimental Examples 1 to 3, 7 to 17, and 21 to 25, the evaluation results of the crystal phase demonstrated the following facts: The ceramic base contained a Mg(Al)O(N) as a main phase, in which XRD peaks corresponding to the (111), (200), and (220) planes of the Mg(Al)O(N) appeared at 2θ=36.9 to 39°, 42.9 to 44.8°, and 62.3 to 65.2°, respectively, the XRD peaks being located between peaks of cubic magnesium oxide and peaks of cubic aluminum nitride. The ceramic base contained Mg—Al oxynitride (Mg—Al—O—N) and spinel (MgAl$_2$O$_4$) as subphases, each of the Mg—Al oxynitride and spinel exhibiting an XRD peak at at least 2θ=47 to 49°. However, the ceramic base did not contain AlN. As typical examples, FIG. 3 illustrates an XRD analysis chart of Experimental Example 1, and FIG. 4 illustrates an enlarged view of the peak of the Mg(Al)O(N) in the XRD analysis chart of Experimental Example 1. Furthermore, Table 1 illustrates positions of the peak maxima corresponding to the (111), (200), and (220) planes of the Mg(Al)O(N) in each of Experimental Examples 1 to 26, the peak spacing (peak shift) between the XRD peak maximum corresponding to the (220) plane of the Mg(Al)O(N) and the peak maximum of magnesium oxide, and the integral breadth of the XRD peak corresponding to the (200) plane of the Mg(Al)O(N). In each of Experimental Examples 6 to 11, 13, 16, 17, and 19 to 26, the peak of spinel overlapped significantly with the peak corresponding to the (111) plane of the Mg(Al)O(N), failing to identify the peak maximum corresponding to the (111) plane. Thus, the position of the peak maximum corresponding to the (111) plane was not described in Table 1. It is believed that a larger peak shift indicates higher solid solubility and that a smaller integral breadth indicates a more uniform state of the solid solution. Note that XRD analysis charts in Experimental Examples 2, 3, 7 to 17, and 20 to 25 are not illustrated because the proportions of the Mg(Al)O(N), the Mg—Al oxynitride, and spinel were different from those in Experimental Example 1. Here, the main phase refers to a component whose volume fraction is 50% or more. The subphase refers to a phase other than the main phase, XRD peaks of the subphase being identified. In the observation of a cross section, the area fraction seemingly reflects the volume fraction. Thus, the main phase is defined as a region having an area fraction of 50% or more in an element mapping image obtained by EPMA. The subphase is defined as a region other than the main phase. In Experimental Example 20, similarly to Experimental Example 1 and so forth, the ceramic base contained three components: Mg(Al)O(N), Mg—Al oxynitride, and spinel. However, the amounts of the components were not so different, so the ceramic base was composed of a composite material in which none of the components served as a main phase. Thus, the foregoing three components were described in the sections of the main phase and the subphase in Table 1. Element mapping images in Experimental Examples 1 and 5 by EPMA are illustrated in FIG. 5. As is clear from FIG. 5, the main phase in Experimental Example 1 is mainly composed of Mg and O. In addition, Al and N are also detected. Thus, the main phase is the Mg(Al)O(N) illustrated in FIGS. 3 and 4. Furthermore, a spinel portion and a few Mg—Al oxynitride portions are observed as subphases. FIG. 5 demonstrated that the Mg(Al)O(N) had an area fraction of about 86% and thus the MgO—AlN solid solution served as a main phase in Experimental Example 1. The same analysis was conducted on other experimental examples and revealed that, for example, the area fractions of the Mg(Al)O(N) in Experimental Examples 7 and 15 were about 59% and about 75%, respectively, and thus the Mg(Al)O(N) served as their main phases. Here, as an example, the identification of the main phase and the subphase was performed by the element mapping by EPMA. Alternatively, any other methods that can distinguish the volume fractions of the phases may be employed.

In the element mapping images by EPMA, different concentrations are indicated by different colors: red, orange, yellow, yellowish green, green, blue, and indigo blue. Red indicates the highest concentration. Indigo blue indicates the lowest concentration. Black indicates zero. While FIG. 5 illustrates monochrome images, the images of FIG. 5 will be described below using the original colors. In Experimental Example 1 (low magnification), for Mg, the background was indicated by orange, and dot portions were indicated by blue. For Al, the background was indicated by blue, and the dot portions were indicated by orange. For N, the background was indicated by blue, and the dot portions were indicated by indigo blue. For O, the background was indicated by orange, and the dot portions were indicated by red. In Experimental Example 1 (high magnification), for Mg, the background (Mg(Al)O(N)) was indicated by orange, an island portion (MgAl$_2$O$_4$) was indicated by blue, and linear portions (Mg—Al—ON: magnesium-aluminum oxynitride) were indicated by green. For Al, the background was indicated by blue, and the island portion and linear portions were indicated by orange. For N, the background was indicated by blue, the island portions were indicated by indigo blue, and linear portions were indicated by green. For O, the background was indicated by orange, the island portions were indicated by red, and linear portions were indicated by green. In Experimental Example 5 (low magnification), the images for Mg and O were indicated by red, and the images for Al and N were indicated by black.

From the evaluation results of the crystal phase, the ceramic base in Experimental Example 4 contained the Mg(Al)O(N) as a main phase but also contained spinel and AlN as subphases. Table 1 illustrates the peak spacing (peak shift) between the XRD peak of the Mg(Al)O(N) and the XRD peak of magnesium oxide in Experimental Example 4. It was speculated that in Experimental Example 4, reactions did not adequately occur at a firing temperature of 1650° C., thus resulting in low solid solubility. At a firing temperature of 1600° C., substantially no reaction occurred. Thus, in the ceramic bases in Experimental Examples 18 and 19, Mg(Al)O(N) was not formed.

The ceramic base in Experimental Example 5 contained MgO as a main phase. The ceramic base in Experimental Example 6 contained spinel as a main phase and MgO as a subphase. The results demonstrated that when the AlN component was not contained in the raw materials, the Al component did not form a solid solution with MgO.

In the case of the ceramic base in each of Experimental Examples 1 to 3, 7 to 13, 17, and 20 to 25, the rate of water loss (the rate of mass decrease measured by TG-DTA in the range of 40° C. to 500° C.) was 2% or less. In the case of the ceramic base in each of Experimental Examples 4, 6, 14 to 16, and 26, the rate of water loss was 3% or less. They had very high moisture resistance, compared with the ceramic base composed of MgO in Experimental Example 5. As typical examples of the moisture resistance test and the water resistance test of the bulk materials, photographs of microstructures in Experimental Examples 2 and 5 are illustrated in FIG. 6, and photographs of microstructures in Experimental Examples 8 and 9 are illustrated in FIG. 7. Higher solid solubility results in higher moisture resistance of the bulk materials. In each of Experimental Examples 1 to 3, 7 to 14, 17, and 20 to 25, in which the peak shift of the peak corresponding to the (220) plane of the Mg(Al)O(N) from magnesium oxide was 0.2° or more, when the moisture resistance test of the bulk material (exposure to the atmosphere at 40° C. and 90 RH % for 28 days) was performed, the surface state remained unchanged and was satisfactory. In each of Experimental Examples 4, 15, 16, and 26, when the moisture resistance test of the bulk material was performed, the surface state was changed. However, the degree of change was low, compared with Experimental Examples 5, 6, 18, and 19, in which acicular and granular precipitates were formed an 40% or more of the surface. The results demonstrated that the moisture resistance of the bulk material depends on the solid solubility of Al and N components in MgO. Specifically, the ceramic base in which the peak shift of the peak corresponding to the (220) plane of the Mg(A)O(N) from magnesium oxide was less than 0.03° was changed on 40% or more of the surface and had low moisture resistance. When the peak shift was 0.03° or more and less than 0.2°, the ceramic base had high moisture resistance. When the peak shift was 0.2° or more, the ceramic base had higher moisture resistance. In other words, when the XRD peak corresponding to the (220) plane of the Mg(Al)O(N) appeared at 62.33° or more and less than 62.50° (2θ), the XRD peak being located between a peak of cubic magnesium oxide and a peak of cubic aluminum nitride, the ceramic base had high moisture resistance. When the XRD peak appeared at 2θ=62.50° or more, the ceramic base had higher moisture resistance. When the XRD peak corresponding to the (200) plane of the Mg(Al)O(N) appeared at 42.92° or more and less than 43.04°, the XRD peak being located between a peak of cubic magnesium oxide and a peak of cubic aluminum nitride, the ceramic base had high moisture resistance. When the XRD peak appeared at 2θ=43.04° or more, the ceramic base had higher moisture resistance.

It was found that the bulk material exhibiting a larger peak shift and a smaller integral breadth had higher moisture resistance. Specifically, in each of Experimental Examples 1, 2, 7, 8, 10 to 13, 17, 20, and 22 to 24, in which the peak shift of the XRD peak corresponding to the (220) plane was 0.42° or more and in which the integral breadth was 0.35° or less, when the water resistance test of the bulk material was performed, the surface state remained unchanged. In each of Experimental Examples 3, 9, 14, and 15, when the water resistance test of the bulk material was performed, a small number of holes due to elution were observed. In each of Experimental Examples 4 to 6, 16, 18, 19, and 26 and in each of Experimental Examples 21 and 25, in which the integral breadth exceeded 0.50°, the trace of elution was observed on 40% or more of the surface. The results demonstrated that the bulk material had satisfactory moisture resistance when the solid solubility of the Al and N components in MgO was higher and the solid solution was uniform. Specifically, the material in which the peak shift of the peak corresponding to the (220) plane of the Mg(A)O(N) from magnesium oxide was 0.05° or less had low water resistance because 40% or more of the surface was eluted. The material in which the peak shift was 0.05° or more and less than 0.42° had high water resistance. The material in which the peak shift was 0.42° or more but in which the integral breadth of the peak corresponding to the (200) plane of the Mg(Al)O(N) was more than 0.35° had high water resistance. The material in which the peak shift was 0.42° or more and in which the integral breadth was 0.35° or less had higher water resistance. In other words, when the XRD peak corresponding to the (220) plane of the Mg(Al)O(N) appeared at 62.35° or more and less than 62.72° (2θ), the XRD peak being located between a peak of cubic magnesium oxide and a peak of cubic aluminum nitride, the material had high water resistance. When the XRD peak corresponding to the (220) plane appeared at 2θ=62.72° or more and when the integral breadth of the peak corresponding to the (200) plane was more than 0.35°, the material had high water resistance. The material in which the XRD peak corresponding to the (220) plane appeared at 2θ=62.72° or more and in which the integral breadth was 0.35° or less had higher water resistance. When the XRD peak corresponding to the (200) plane of the Mg(Al)O(N) appeared at 42.95° or more and less than 43.17° (2θ), the XRD peak being located between a peak of cubic magnesium oxide and a peak of cubic aluminum nitride, the material had high water resistance. The material in which the XRD peak appeared at 2θ=43.17° or more had higher water resistance.

The evaluation results of the etching rate illustrated in Table 2 demonstrated that the ceramic base in each of Experimental Examples 1 to 3, 12, and 14 to 16 had high corrosion resistance comparable to that of the MgO ceramic material in Experimental Example 5. The evaluation results of the etching rate demonstrated that the ceramic base in each of Experimental Examples 4, 7 to 11, 13, and 21 to 25 had corrosion resistance slightly lower than that of MgO in Experimental Example 5 but had higher corrosion resistance than those of the ceramic base in Experimental Example 6, i.e., those of the material containing spinel as a main phase and yttria (not illustrated in the table, etching rate: about 240 nm/h). The ceramic base in each of Experimental Examples 1 to 3, 7 to 15, 17, and 21 to 25 contained the Mg—Al oxynitride (Mg—Al—O—N) phase as a subphase. A higher Mg—Al oxynitride phase content resulted in higher mechanical properties. Upon letting the XRD peak intensity of the Mg—Al oxynitride phase observed at 2θ=47 to 49° be A, and letting the intensity of the XRD peak corresponding to the (220) plane of the Mg(Al)O(N) observed at 2θ=62.3 to 65.2° be B, the value of A/B was described in Table 2. A higher value of A/B indicated a higher Mg—Al oxynitride content. Both of the fracture toughness and the bending strength were improved with increasing A/B. In each of Experimental Examples 7 to 11, 13, 15, 17, 20, 21, and 23 to 25, in which the value of A/B was 0.03 or more, it was found that the ceramic base had a fracture toughness of 2.5 or more and a high bending strength of 180 MPa or more. In each of Experimental Examples 7 to 10, 13, 15, 17, 20, 21, and 23 to 25, it was found that the ceramic base had a high bending strength of 200 MPa or more. In Experimental Example 22, although the value of A/B was 0.03 or more, the bending strength and the fracture toughness were not sufficiently provided because of the occurrence of cracking around the Mg—Al oxynitride phase whose grains were grown by the higher firing temperature than those of the ceramic bases each exhibiting a value of A/B of 0.03 or more. Regarding A/B, for example, in Experimental Example 8, A was 4317 counts, B was 83731 counts, the value of A/B was 0.039, the fracture toughness was 2.5, and the strength was 222 MPa. In Experimental Example 15, A was 13,566 counts, B was 108,508 counts, the value of A/B was 0.125, the fracture toughness was 4.4, and the strength was 350 MPa. However, an increase in Mg—Al oxynitride content resulted in a reduction in the proportion of the Mg(Al)O(N) having high corrosion resistance, thus reducing the corrosion resistance. For example, in Experimental Example 17, in which the value of A/B was 0.3 or more, the etching rate reached 181 nm/h. In Experimental Example 20, in which the value of A/B was more than 0.4, the corrosion resistance was the same level as that of spinel. The results demonstrated that a value of A/B of 0.03 to 0.14 resulted in both good corrosion resistance and good mechanical strength.

The volume resistivity of the ceramic base in each of Experimental Examples 2, 3, 8, 10, 15, 23, and 24 was $1 \times 10^{17}$ Ωcm or more at room temperature. The value of the volume resistivity was comparable to that of MgO Experimental Example 5. The results demonstrated that the ceramic base is suitably used for members, such as electrostatic chucks and heaters, required to have high resistance for use in semiconductor manufacturing equipment.

The volume resistivities of the ceramic bases in Experimental Examples 5 and 12 were $2 \times 10^{12}$ Ωcm and $2 \times 10^{10}$ Ωcm, respectively, at 600° C. The ceramic base in Experimental Example 12 had a low electrical resistance, compared with MgO (Experimental Example 5). As with Experimental Example 12, it was found that the ceramic base in each of Experimental Examples 1 and 3 also had a low electrical resistance, compared with Experimental Example 5.

Examples of the production of ceramic members (embedded electrode members) each including a ceramic base and an electrode will be described below as. In Examples 1 to 60 and Comparative Examples 1 to 3, as raw material MgO, a commercial item having a purity of 99.4% by mass and an average particle size of 3 an was used. As raw material $Al_2O_3$, a commercial item having a purity of 99.9% by mass and an average particle size of 0.5 μm was used. As raw material AlN, a commercial item having a purity of 99% by mass and an average particle size of 1 μm or less was used. In Examples 61 to 66, as $ZrO_2$, a commercial item having a purity of 99% by mass (purity: $ZrO_2+HfO_2$) and an average particle size of 0.1 μm was used. In Examples 67 to 72, a commercial item (3Y—$ZrO_2$), in which $ZrO_2$ containing 3% by mole $Y_2O_3$ had a purity of 99% by mass (purity: $ZrO_2+HfO_2+Y_2O_3$) and an average particle size of 0.1 μm, was used. In Examples 73 to 78, a commercial item (8Y—$ZrO_2$), in which $ZrO_2$ containing 8% by mole $Y_2O_3$ had a purity of 99% by mass (purity: $ZrO_2+HfO_2+Y_2O_3$) and an average particle size of 0.1 μm, was used. In Examples 79 and 80, a commercial item (13Ca—$ZrO_2$), in which $ZrO_2$ containing 13% by mole CaO had a purity of 99% by mass (purity: $ZrO_2+HfO_2+CaO$) and an average particle size of 0.1 μm, was used. In Examples 81 to 86, a commercial item (3Y—$ZrO_2$), in which $ZrO_2$ containing 3% by mole $Y_2O_3$ had a purity of 99% by mass (purity: $ZrO_2+HfO_2+Y_2O_3$) and an average particle size of 0.1 μm, and as raw material $Al_2O_3$, and a commercial item having a purity of 99.9% by mass and an average particle size of 0.5 μm were used. The embedded electrode member was produced by producing a first sintered compact, applying an electrode paste to the first sintered compact, arranging a second green compact (unfired) or a second sintered compact so as to cover the electrode, and performing sintering.

Production of Ceramic Member

A first sintered compact containing magnesium oxide was produced as described below. As preparation treatment, raw material MgO, raw material $Al_2O_3$, and raw material AlN were weighed in amounts (% by mass) described in Tables 3 and 4. These materials were wet-mixed for 4 hours in a nylon pot with iron-cored nylon balls 20 nm in diameter using isopropyl alcohol as a solvent. After the completion of the mixing, the resulting slurry was taken out and dried at 110° C. in a stream of nitrogen. Then the mixture was passed through a 30-mesh sieve to provide a powder mixture. Next, as first compacting treatment, the powder mixture was subjected to uniaxial pressing at 100 kgf/cm² to form a disk-like green compact having a diameter of about 50 mm and a thickness of about 20 mm. The green compact was placed in a graphite mold for firing. Subsequently, as first firing treatment, the disk-like green compact was subjected to hot-press firing to provide the first sintered compact. The hot-press firing was performed at a pressing pressure of 200 kgf/cm$^2$ and a firing temperature of 1775° C. An Ar atmosphere was maintained until the firing was completed. The holding time at the firing temperature was 4 hours. Then, as processing treatment, the first sintered compact was processed to form a disk having a diameter of about 50 nm and a thickness of 3.5 mm. Here, one of the surfaces was polished with an abrasive (#800). The polished surface served as a surface for the application of the electrode paste to be applied.

A first sintered compact containing zirconium oxide as a main component was produced as described below. In each of Examples 61 to 80, as first compacting treatment, powders weighed in amounts (% by mass) described in Table 5 were subjected to uniaxial pressing at 100 kgf/cm$^2$ to form a disk-like green compact having a diameter of about 50 mm and a thickness of about 20 mm. The green compact was placed in a graphite mold for firing. Subsequently, as first firing treatment, the disk-like green compact was subjected to hot-press firing to provide the first sintered compact. The hot-press firing was performed at a pressing pressure of 200 kgf/cm$^2$ and a firing temperature of 1300° C. An Ar atmosphere was maintained until the firing was completed. The holding time at the firing temperature was 4 hours. Then, as processing treatment, the first sintered compact was processed to form a disk having a diameter of about 50 mm and a thickness of 3.5 mm. Here, one of the surfaces was polished with an abrasive (#800). The polished surface served as a surface for the application of the electrode paste to be applied.

A first sintered compact containing zirconium oxide and aluminum oxide was produced as described below. In each of Examples 81 to 86, as preparation treatment, raw material $ZrO_2$ and raw material $Al_2O_3$ were weighed in amounts (% by mass) described in Table 5. These materials were wet-mixed for 4 hours in a nylon pot with iron-cored nylon balls 20 mm in diameter using isopropyl alcohol as a solvent. After the completion of the mixing, the resulting slurry was taken out and dried at 110° C. in a stream of nitrogen. Then the mixture was passed through a 30-mesh sieve to provide a powder mixture. Next, as first compacting treatment, the powder mixture was subjected to uniaxial pressing at 100 kgf/cm$^2$ to form a disk-like green compact having a diameter of about 50 mm and a thickness of about 20 mm. The green compact was placed in a graphite mold for firing. Subsequently, as first firing treatment, the disk-like green compact was subjected to hot-press firing to provide the first sintered compact. The hot-press firing was performed at a pressing pressure of 200 kgf/cm$^2$ and a firing temperature of 1300° C. An Ar atmosphere was maintained until the firing was completed. The holding time at the firing temperature was 4 hours. Then, as processing treatment, the first sintered compact was processed to form a disk having a diameter of about 50 nm and a thickness of 3.5 nm. Here, one of the surfaces was polished with an abrasive (#800). The polished surface served as a surface for the application of the electrode paste to be applied.

Next, as electrode formation treatment, the electrode paste was applied to the surface of the first sintered compact to form an electrode pattern. Regarding electrode components as electrode raw materials, a pulverized Ru powder prepared by pulverizing a commercial Ru powder to 10 µm and a commercial Al powder (10 µm) were mixed together in ratios (mol %) described in Tables 3, 4, and 5, and the resulting mixtures were used. Alternatively, the pulverized Ru powder and the commercial Al powder were mixed together in ratios (mol %) described in Tables 3, 4, and 5 and heated at 1200° C. in an Ar atmosphere to synthesize a RuAl alloy. Then the resulting RuAl alloy was wet-pulverized to an average particle size of 10 µm. The resulting RuAl alloy powder was used. In addition, samples were prepared in which MgO serving as a filler was added to an electrode paste containing 100 mol % of Ru and Al in amounts (% by volume) described in Tables 3 and 4. The electrode paste was prepared by mixing and kneading the electrode raw material, an organic solvent, and a binder. As the binder and the organic solvent, a n-butyl polymethacrylate/butyl carbitol mixture was used. A 5-m wide and 15-mm-long electrode was formed on the surface of the first sintered compact by screen printing with the electrode past. In this case, the electrode had a wet thickness of 50 to 100 µm. After the printing, drying was performed in the atmosphere at 100° C. for 1 hour.

Next, a firing step of co-firing a ceramic base and the electrode was performed. As lamination treatment, the same powder mixture as the raw material of the first sintered compact was subjected to uniaxial pressing at 100 kgf/cm$^2$ to form a disk-like second green compact having a diameter of about 50 nm and a thickness of about 20 mm. In each of Examples 1 to 58 and 61 to 86 and (Comparative Examples 1 to 3, the second green compact was stacked on the surface of the first sintered compact on which the electrode pattern had been formed, thereby providing a laminate having a three-layer structure of first sintered compact/electrode pattern/second green compact. In each of Examples 59 and 60, a second sintered compact produced in the same way as the first sintered compact was stacked on the surface of the first sintered compact on which the electrode pattern had been formed, thereby providing a laminate having a three-layer structure of first sintered compact/electrode pattern/second sintered compact. Subsequently, the laminate was placed in a carbon jig for hot-press firing. As second firing treatment, the laminate was subjected to hot-press firing at the same temperature as the first firing treatment. In the second firing treatment, the pressing pressure was 200 kgf/cm$^2$. An Ar atmosphere was maintained until the firing was completed. The holding time at the firing temperature was 4 hours. In this way, the green compact and the electrode pattern were sintered to form a second sintered compact and an electrode. Simultaneously, the first sintered compact, the electrode, and the second sintered compact were bonded together to form a monolithic ceramic member with a built-in electrode. A piece was cut from the monolithic ceramic member and used for evaluation tests described below. Instead of the first sintered compact, a first portion may be formed into a green compact. An article in which an electrode pattern is formed on a surface of the green compact may be prepared. After stacking the second green compact on the article, hot-pressing firing may be performed to produce a ceramic member (embedded electrode member).

Examples 1 to 86

Embedded electrode members in Examples 1 to 86 were produced under conditions described in Tables 3, 4, and 5. In Examples 1 to 10, ceramic bases were composed of a magnesium oxide solid solution, and electrodes were made from mixed pastes containing a Ru powder and an Al powder, the mixed pastes having different Ru/Al ratios. In Examples 11 to 20, bases were composed of the magnesium oxide solid solution, and electrodes were made from alloy pastes containing RuAl alloy powders having different Ru/Al ratios. In Examples 21 to 24, electrodes were made from mixed pastes having different MgO contents. In Examples 25 to 28, electrodes were made from alloy pastes having different MgO contents. In Examples 29 to 32, 37 to 40, 45 to 48, and 53 to 55, bases were composed of magnesium oxide solid solutions having different compositions, and electrodes were made from mixed pastes having different Ru/Al ratios. In Examples 33 to 36, 41 to 44, 49 to 52, and 56 to 58, bases were composed of magnesium oxide solid solutions having different compositions, and electrodes were made from alloy pastes having different Ru/Al ratios. In Examples 1 to 58, embedded electrode members were produced with combinations of first sintered compacts composed of magnesium oxide solid solutions and second green compacts. In Example 59, an electrode was made from a mixed paste, and an embedded electrode member was produced with a combination of two sintered compacts, i.e., a first sintered compact composed of a magnesium oxide solid solution and a second sintered compact. In Example 60, an electrode was made from an alloy paste, and an embedded electrode member was produced with a combination of two sintered compacts, i.e., a first sintered compact composed of a magnesium oxide solid solution and a second sintered compact. In Examples 61 to 63, 67 to 69, 73 to 75, and 79, bases were composed of zirconium oxides, and electrodes were made from mixed pastes containing the Ru powder and the Al powder, the mixed pastes having different Ru/Al ratios. In Examples 64 to 66, 70 to 72, 76 to 78, and 80, bases were composed of zirconium oxides, and electrodes were made from alloy pastes containing RuAl alloy powders having different Ru/Al ratios. In Examples 81 to 83, bases were composed of a composite material of zirconium oxide and aluminum oxide, and electrodes were made from mixed pastes containing the Ru powder and the Al powder, the mixed pastes having different Ru/Al ratios. In Examples 84 to 86, bases were composed of the composite material of zirconium oxide and aluminum oxide, and electrodes were made from alloy pastes containing RuAl alloy powders having different Ru/Al ratios. In Examples 61 to 86, embedded electrode members were produced with combinations of first sintered compacts mainly composed of zirconium oxides and second green compacts.

Comparative Examples 1 to 3

Embedded electrode members according to Comparative Examples 1 to 3 were produced under conditions described in Table 3. In Comparative Example 1, an electrode was made from a Ru powder alone. In Comparative Example 2, an electrode was made from a mixed paste containing the Ru powder and an Al powder. In Comparative Example 3, an electrode was made from an alloy paste containing the Ru powder and the Al powder. In Comparative Examples 1 to 3, embedded electrode members were produced with combinations of first sintered compacts composed of magnesium oxide solid solutions and second green compacts. Tables 3 to 5 summarize the amounts of raw materials for the ceramic bases, the compositions of the electrodes, and the types of the electrode pastes in Examples 1 to 86 and Comparative Examples 1 to 3.

TABLE 3

| | Preparatino of Base | | | Preparation of Electrode[1] | | | |
|---|---|---|---|---|---|---|---|
| | MgO mass % | $Al_2O_3$ mass % | AlN mass % | Ru mol % | Al mol % | MgO vol % | Kind of Paste[2] |
| EXAMPLE 1 | 60 | 30 | 10 | 90 | 10 | 0 | Mixed Past |
| EXAMPLE 2 | 60 | 30 | 10 | 80 | 20 | 0 | Mixed Past |
| EXAMPLE 3 | 60 | 30 | 10 | 70 | 30 | 0 | Mixed Past |
| EXAMPLE 4 | 60 | 30 | 10 | 60 | 40 | 0 | Mixed Past |
| EXAMPLE 5 | 60 | 30 | 10 | 55 | 45 | 0 | Mixed Past |
| EXAMPLE 6 | 60 | 30 | 10 | 50 | 50 | 0 | Mixed Past |
| EXAMPLE 7 | 60 | 30 | 10 | 47.5 | 52.5 | 0 | Mixed Past |
| EXAMPLE 8 | 60 | 30 | 10 | 45 | 55 | 0 | Mixed Past |
| EXAMPLE 9 | 60 | 30 | 10 | 40 | 60 | 0 | Mixed Past |
| EXAMPLE 10 | 60 | 30 | 10 | 30 | 70 | 0 | Mixed Past |
| EXAMPLE 11 | 60 | 30 | 10 | 90 | 10 | 0 | Alloy Paste |
| EXAMPLE 12 | 60 | 30 | 10 | 80 | 20 | 0 | Alloy Paste |
| EXAMPLE 13 | 60 | 30 | 10 | 70 | 30 | 0 | Alloy Paste |
| EXAMPLE 14 | 60 | 30 | 10 | 60 | 40 | 0 | Alloy Paste |
| EXAMPLE 15 | 60 | 30 | 10 | 55 | 45 | 0 | Alloy Paste |
| EXAMPLE 16 | 60 | 30 | 10 | 50 | 50 | 0 | Alloy Paste |
| EXAMPLE 17 | 60 | 30 | 10 | 47.5 | 52.5 | 0 | Alloy Paste |
| EXAMPLE 18 | 60 | 30 | 10 | 45 | 55 | 0 | Alloy Paste |
| EXAMPLE 19 | 60 | 30 | 10 | 40 | 60 | 0 | Alloy Paste |
| EXAMPLE 20 | 60 | 30 | 10 | 30 | 70 | 0 | Alloy Paste |
| EXAMPLE 21 | 60 | 30 | 10 | 50 | 50 | 10 | Mixed Past |
| EXAMPLE 22 | 60 | 30 | 10 | 50 | 50 | 20 | Mixed Past |
| EXAMPLE 23 | 60 | 30 | 10 | 50 | 50 | 30 | Mixed Past |
| EXAMPLE 24 | 60 | 30 | 10 | 50 | 50 | 40 | Mixed Past |
| EXAMPLE 25 | 60 | 30 | 10 | 50 | 50 | 10 | Alloy Paste |
| EXAMPLE 26 | 60 | 30 | 10 | 50 | 50 | 20 | Alloy Paste |
| EXAMPLE 27 | 60 | 30 | 10 | 50 | 50 | 30 | Alloy Paste |
| EXAMPLE 28 | 60 | 30 | 10 | 50 | 50 | 40 | Alloy Paste |
| COMPARATIVE EXAMPLE 1 | 60 | 30 | 10 | 100 | 0 | 0 | Mixed Past |
| COMPARATIVE EXAMPLE 2 | 60 | 30 | 10 | 20 | 80 | 0 | Mixed Past |
| COMPARATIVE EXAMPLE 3 | 60 | 30 | 10 | 20 | 80 | 0 | Alloy Paste |

[1]MgO was added based on mass % relative to 100 mol % of Ru and Al or RuAl.
[2]Mixed paste containing Ru powder and Al powder.
Alloy paste containing RuAl alloy powders prepared in advance.

TABLE 4

| | Preparation of Base | | | Preparation of Electrode[1] | | | |
|---|---|---|---|---|---|---|---|
| | MgO mass % | $Al_2O_3$ mass % | AlN mass % | Ru mol % | Al mol % | MgO vol % | Kind of Paste[2] |
| EXAMPLE 29 | 100 | 0 | 0 | 60 | 40 | 0 | Mixed Paste |
| EXAMPLE 30 | 100 | 0 | 0 | 50 | 50 | 0 | Mixed Paste |
| EXAMPLE 31 | 100 | 0 | 0 | 40 | 60 | 0 | Mixed Paste |
| EXAMPLE 32 | 100 | 0 | 0 | 30 | 70 | 0 | Mixed Paste |
| EXAMPLE 33 | 100 | 0 | 0 | 60 | 40 | 0 | Alloy Paste |
| EXAMPLE 34 | 100 | 0 | 0 | 50 | 50 | 0 | Alloy Paste |
| EXAMPLE 35 | 100 | 0 | 0 | 40 | 60 | 0 | Alloy Paste |
| EXAMPLE 36 | 100 | 0 | 0 | 30 | 70 | 0 | Alloy Paste |
| EXAMPLE 37 | 80 | 12 | 8 | 80 | 20 | 0 | Mixed Paste |
| EXAMPLE 38 | 80 | 12 | 8 | 60 | 40 | 0 | Mixed Paste |
| EXAMPLE 39 | 80 | 12 | 8 | 40 | 60 | 0 | Mixed Paste |
| EXAMPLE 40 | 80 | 12 | 8 | 30 | 70 | 0 | Mixed Paste |
| EXAMPLE 41 | 80 | 12 | 8 | 80 | 20 | 0 | Alloy Paste |
| EXAMPLE 42 | 80 | 12 | 8 | 60 | 40 | 0 | Alloy Paste |
| EXAMPLE 43 | 80 | 12 | 8 | 40 | 60 | 0 | Alloy Paste |
| EXAMPLE 44 | 80 | 12 | 8 | 30 | 70 | 0 | Alloy Paste |
| EXAMPLE 45 | 49 | 30 | 21 | 90 | 10 | 0 | Mixed Paste |
| EXAMPLE 46 | 49 | 30 | 21 | 70 | 30 | 0 | Mixed Paste |
| EXAMPLE 47 | 49 | 30 | 21 | 50 | 50 | 0 | Mixed Paste |
| EXAMPLE 48 | 49 | 30 | 21 | 30 | 70 | 0 | Mixed Paste |
| EXAMPLE 49 | 49 | 30 | 21 | 90 | 10 | 0 | Alloy Paste |
| EXAMPLE 50 | 49 | 30 | 21 | 70 | 30 | 0 | Alloy Paste |
| EXAMPLE 51 | 49 | 30 | 21 | 50 | 50 | 0 | Alloy Paste |
| EXAMPLE 52 | 49 | 30 | 21 | 30 | 70 | 0 | Alloy Paste |
| EXAMPLE 53 | 25 | 50 | 30 | 90 | 10 | 0 | Mixed Paste |
| EXAMPLE 54 | 25 | 50 | 30 | 70 | 30 | 0 | Mixed Paste |
| EXAMPLE 55 | 25 | 50 | 30 | 50 | 50 | 0 | Mixed Paste |
| EXAMPLE 56 | 25 | 50 | 30 | 90 | 10 | 0 | Alloy Paste |
| EXAMPLE 57 | 25 | 50 | 30 | 70 | 30 | 0 | Alloy Paste |
| EXAMPLE 58 | 25 | 50 | 30 | 50 | 50 | 0 | Alloy Paste |
| EXAMPLE 59 | 60 | 30 | 10 | 50 | 50 | 0 | Mixed Paste |
| EXAMPLE 60 | 60 | 30 | 10 | 50 | 50 | 0 | Alloy Paste |

[1]MgO was added based on mass % relative to 100 mol % of Ru and Al or RuAl.
[2]Mixed paste containing Ru powder and Al powder.
Alloy paste containing RuAl alloy powders prepared in advance.

TABLE 5

| | Preparation of Base | | | | | Preparation of Electrode | | |
|---|---|---|---|---|---|---|---|---|
| | $ZrO_2$ mass % | $3Y-ZrO_2$[2] mass % | $8Y-ZrO_2$[3] mass % | $13Ca-ZrO_2$[4] mass % | $Al_2O_3$ mass % | Ru mol % | Al mol % | Kind of Paste[1] |
| EXAMPLE 61 | 100 | 0 | 0 | 0 | 0 | 70 | 30 | Mixed Paste |
| EXAMPLE 62 | 100 | 0 | 0 | 0 | 0 | 50 | 50 | Mixed Paste |
| EXAMPLE 63 | 100 | 0 | 0 | 0 | 0 | 30 | 70 | Mixed Paste |
| EXAMPLE 64 | 100 | 0 | 0 | 0 | 0 | 70 | 30 | Alloy Paste |
| EXAMPLE 65 | 100 | 0 | 0 | 0 | 0 | 50 | 50 | Alloy Paste |
| EXAMPLE 66 | 100 | 0 | 0 | 0 | 0 | 30 | 70 | Alloy Paste |
| EXAMPLE 67 | 0 | 100 | 0 | 0 | 0 | 80 | 20 | Mixed Paste |
| EXAMPLE 68 | 0 | 100 | 0 | 0 | 0 | 50 | 50 | Mixed Paste |
| EXAMPLE 69 | 0 | 100 | 0 | 0 | 0 | 30 | 70 | Mixed Paste |
| EXAMPLE 70 | 0 | 100 | 0 | 0 | 0 | 80 | 20 | Alloy Paste |
| EXAMPLE 71 | 0 | 100 | 0 | 0 | 0 | 50 | 50 | Alloy Paste |
| EXAMPLE 72 | 0 | 100 | 0 | 0 | 0 | 30 | 70 | Alloy Paste |
| EXAMPLE 73 | 0 | 0 | 100 | 0 | 0 | 80 | 20 | Mixed Paste |
| EXAMPLE 74 | 0 | 0 | 100 | 0 | 0 | 50 | 50 | Mixed Paste |
| EXAMPLE 75 | 0 | 0 | 100 | 0 | 0 | 30 | 70 | Mixed Paste |
| EXAMPLE 76 | 0 | 0 | 100 | 0 | 0 | 80 | 20 | Alloy Paste |
| EXAMPLE 77 | 0 | 0 | 100 | 0 | 0 | 50 | 50 | Alloy Paste |
| EXAMPLE 78 | 0 | 0 | 100 | 0 | 0 | 30 | 70 | Alloy Paste |
| EXAMPLE 79 | 0 | 0 | 0 | 100 | 0 | 50 | 50 | Mixed Paste |
| EXAMPLE 80 | 0 | 0 | 0 | 100 | 0 | 50 | 50 | Mixed Paste |
| EXAMPLE 81 | 0 | 75 | 0 | 0 | 25 | 90 | 10 | Mixed Paste |
| EXAMPLE 82 | 0 | 75 | 0 | 0 | 25 | 50 | 50 | Mixed Paste |
| EXAMPLE 83 | 0 | 75 | 0 | 0 | 25 | 40 | 60 | Mixed Paste |
| EXAMPLE 84 | 0 | 75 | 0 | 0 | 25 | 90 | 10 | Alloy Paste |

TABLE 5-continued

|  | Preparation of Base | | | | | Preparation of Electrode | | |
| --- | --- | --- | --- | --- | --- | --- | --- | --- |
|  | ZrO$_2$ mass % | 3Y—ZrO$_2$[2)] mass % | 8Y—ZrO$_2$[3)] mass % | 13Ca—ZrO$_2$[4)] mass % | Al$_2$O$_3$ mass % | Ru mol % | Al mol % | Kind of Paste[1)] |
| EXAMPLE 85 | 0 | 75 | 0 | 0 | 25 | 50 | 50 | Alloy Paste |
| EXAMPLE 86 | 0 | 75 | 0 | 0 | 25 | 40 | 60 | Alloy Paste |

[1)]Mixed paste containing Ru powder and Al powder.
Alloy paste containing RuAl alloy powders prepared in advance.
[2)]ZrO$_2$ contaitninf 3 mol % of Y$_2$O$_3$.
[3)]ZrO$_2$ contaitning 8 mol % of Y$_2$O$_3$.
[4)]ZrO$_2$ containing 13 mol % of CaO.

Electrical Resistivity

Rectangular parallelepiped test pieces each having a width of 9 mm, a length of 9 mm, and a thickness of about 6 mm were cut from the resulting monolithic ceramic members with built-in electrodes. In each of the test pieces according to Examples 1 to 86 and Comparative Examples 1 to 3, the center of the electrode in the width direction was matched with the center of the test piece in the width direction, and the electrode was exposed at both ends in the longitudinal direction. The electrical resistivity was measured as described below: Lead wires were connected to both ends (surfaces where electrode was exposed) of each test piece in the longitudinal direction with a conductive paste to form a circuit. Regarding measurement conditions, a minute electric current was applied in the range of 150 mA to 0 mA in the atmosphere at roan temperature (20° C.). The resulting minute voltage was measured to determine an electrode resistance R. The resistivity ρ (Ωcm) was calculated from the expression ρ=R× S/L, where R represents the resistance (Ω), S represents the area (cm$^2$) of the exposed surface of the electrode, and L represents the length (cm) of the electrode.

Evaluation of Microstructure after the Embedding of Electrode

Each of the resulting monolithic ceramic members with built-in electrodes was cut to expose the electrode. A cut surface was mirror-polished, and then an evaluation as to whether a crack was formed in the ceramic base around the electrode was made with a scanning electron microscope (SEM). Furthermore, to evaluate the reactivity between the electrode components and the ceramic base, electron probe microanalysis (EPMA) was performed.

XRD Analysis of Electrode

Each of the resulting monolithic ceramic members with built-in electrodes was cut to expose the electrode. A cut surface was mirror-polished, and then the crystal phase of the electrode was identified with an X-ray diffractometer. Measurement conditions were as follows: CuKα, 40 kV, 40 mA, 2θ=5 to 70°. The measurement step size was 0.02°. A sealed tube-type X-ray diffractometer (D8 ADVANCE, manufactured by Bruker AXS) was used.

Evaluation of Cracking and Electrode Melting

Each of the resulting monolithic ceramic members with built-in electrodes was cut at a portion of the member where the electrode was included. A cut surface was mirror-polished. The resulting mirror surface was observed with an electron microscope (SEM, model XL30, manufactured by Philips). The presence or absence of a crack was determined on the basis of an SEM image. The case where no crack was observed was rated as "○". The case where a crack was observed was rated as "x". Furthermore, the case where the electrode was not melted was rated as "○". The case where the electrode was melted was rated as "x".

Evaluation of Reactivity

The reactivity of the electrode components and the base materials of the resulting monolithic ceramic members with built-in electrodes was studied. A cross section was observed with an electron microscope (SEM, model XL30, manufactured by Philips). The reactivity was evaluated on the basis of investigation as to whether an element in the electrode was contained in the base material by elementary analysis with EPMA (JXA-8800RL, manufactured by JEOL Ltd), in the vicinity of the boundary between the electrode and the base material. Evaluation criteria are described below. The case where the diffusion of the electrode component or the shift of the base composition was not observed in the base material in the vicinity of the electrode was rated as "⊙". The case where the diffusion of the electrode component or the shift of the base composition occurred in a region of the base material which extended from the boundary to a position 30 μm or less away from the boundary and which was located in the vicinity of the electrode was rated as "○". The case where the diffusion of the electrode component or the shift of the base composition occurred in a region of the base material which extended from the boundary to a position 100 μm or less away from the boundary and which was located in the vicinity of the electrode was rated as "Δ". The case where the diffusion of the electrode component or the shift of the base composition occurred in a region of the base material which extended from the boundary to a position more than 100 μm away from the boundary and which was located in the vicinity of the electrode was rated as "x".

Measurement of Thermal Expansion Coefficient of Ceramic Base

Thermal expansion coefficients of sintered compacts produced in the same ways as in the respective examples were measured by a method according to JIS-R1618 at a temperature range of 40° C. to 1000° C. The resulting thermal expansion coefficients were defined as those of the ceramic bases.

Thermal Expansion Coefficient of Electrode

Thermal expansion coefficients of the electrodes were calculated on the basis of the volume fractions of the electrode components and the filler. Regarding the volume fractions of the components, a cross section was observed with an electron microscope (SEM, model XL30, manufactured by Philips), and then the area ratios of the components calculated by image analysis were used as the volume fractions. In SEM observation, different levels of contrast were observed in response to the elemental components and the compositions. The thermal expansion coefficient of each of the components was measured by the method according to JIS-R1618 at a temperature range of 40° C. to 1000° C. The resulting values of the thermal expansion coefficients were used: MgO: 13 ppm/K, ZrO$_2$: 11.5 ppm/K, 3Y—ZrO$_2$: 11 ppm/K, 8Y—ZrO$_2$: 10.5 ppm/K, 13Ca—ZrO$_2$: 11 ppm/K, RuAl: 10.5 ppm/K, Ru$_2$Al$_3$: 13.5 ppm/K, and Ru$_3$Al$_{13}$: 15 ppm/K.

Evaluation Result and Discussion

Tables 6 to 8 summarize the evaluation results regarding, for example, the electrode crystal phase, the resistivity (Ωcm), the presence or absence of a crack, whether the electrode was melted or not, and whether the electrode components and the base materials were reacted or not, in Examples 1 to 86 and Comparative Examples 1 to 3. As described in Examples 1 to 86 in Tables 6 to 8, for the electrodes in examples, a crack was not formed in each of the ceramic bases, and a low resistance of 5.5×10$^{-5}$ Ωcm or less was provided. In Examples 1 to 86, the EPMA analysis of the ceramic bases revealed only a slight diffusion of the electrode components in the ceramic bases. The XRD analysis of the electrodes in the ceramic members revealed that the crystal phases of the electrode components after embedding were Ru, RuAl, MgO as the filler, Ru$_2$Al$_3$, and so forth. The results demonstrated that the RuAl alloy may have a low reactivity to Mg(Al)O(N) and ZrO$_2$ contained in the bases. Regarding the thermal expansion coefficients of the materials, MgO had a thermal expansion coefficient of 13 ppm/K. AlN had a thermal expansion coefficient of 5 ppm/K. Al$_2$O$_3$ had a thermal expansion coefficient of 8 ppm/K. Mg(Al)O(N) had a thermal expansion coefficient of about 11 ppm/K. The RuAl alloy had a thermal expansion coefficient of 10.5 ppm/K. Thus, in Examples 1 to 86, regarding the difference in thermal expansion coefficient between the ceramic bases and the electrodes, the difference in thermal expansion coefficient between MgO and the RuAl alloy was determined to be 2.5 ppm/K or less. The difference in thermal expansion coefficient between Mg(Al)O(N) and the RuAl alloy was determined to be 0.8 ppm/K or less. Hence, the occurrence of cracking due to the difference in thermal expansion coefficient after sintering was further suppressed. In Examples 59 and 60, in which the ceramic members were produced with the first sintered compacts and the second sintered compacts, the resulting ceramic members had the same tendency as the ceramic members produced with the first sintered compacts and the second green compacts. In contrast, in each of Comparative Examples 1 to 3, cracking occurred in part of the ceramic base around the electrode, as described in Table 6. In each of Comparative Examples 2 and 3, the EPMA analysis revealed that the Al component was diffused in a region of the ceramic base extending from the boundary to a position 100 μm or more away from the boundary. In each of Comparative Examples 2 and 3, the Al content of the electrode material was as high as 80% by mole. Thus, a heterophase (Ru$_3$Al$_{13}$) was detected by XRD analysis.

TABLE 6

| | Electrode Crystal Phase[1] | Resistivity Ωcm | Thermal Expansion Coefficient of Base ppm K$^{-1}$ | Thermal Expansion Coefficient of Electorde ppm K$^{-1}$ | Crack | Melting | Reactivity of Electrode Component and Base Material |
|---|---|---|---|---|---|---|---|
| EXAMPLE 1 | Ru, RuAl, MgO | 5.0 × 10$^{-6}$ | 10.7 | 9 | ○ | ○ | ○ |
| EXAMPLE 2 | RuAl, Ru, MgO | 4.1 × 10$^{-6}$ | 10.7 | 9.5 | ○ | ○ | ○ |
| EXAMPLE 3 | RuAl, Ru, MgO | 3.5 × 10$^{-6}$ | 10.7 | 10 | ○ | ○ | ○ |
| EXAMPLE 4 | RuAl, MgO | 2.0 × 10$^{-6}$ | 10.7 | 10.7 | ○ | ○ | ○ |
| EXAMPLE 5 | RuAl, MgO | 1.2 × 10$^{-6}$ | 10.7 | 10.7 | ○ | ○ | ◎ |
| EXAMPLE 6 | RuAl, MgO | 1.2 × 10$^{-6}$ | 10.7 | 10.7 | ○ | ○ | ◎ |
| EXAMPLE 7 | RuAl, MgO | 1.2 × 10$^{-6}$ | 10.7 | 10.7 | ○ | ○ | ◎ |
| EXAMPLE 8 | RuAl, MgO | 1.2 × 10$^{-6}$ | 10.7 | 10.7 | ○ | ○ | ◎ |
| EXAMPLE 9 | RuAl, MgO | 1.8 × 10$^{-6}$ | 10.7 | 10.8 | ○ | ○ | ◎ |
| EXAMPLE 10 | RuAl, Ru$_2$Al$_3$, MgO | 5.0 × 10$^{-6}$ | 10.7 | 12 | ○ | ○ | ○ |
| EXAMPLE 11 | Ru, RuAl, MgO | 4.0 × 10$^{-6}$ | 10.7 | 9 | ○ | ○ | ○ |
| EXAMPLE 12 | RuAl, Ru, MgO | 3.4 × 10$^{-6}$ | 10.7 | 9.5 | ○ | ○ | ○ |
| EXAMPLE 13 | RuAl, Ru, MgO | 2.8 × 10$^{-6}$ | 10.7 | 10 | ○ | ○ | ○ |
| EXAMPLE 14 | RuAl, MgO | 1.5 × 10$^{-6}$ | 10.7 | 10.7 | ○ | ○ | ○ |
| EXAMPLE 15 | RuAl, MgO | 1.0 × 10$^{-6}$ | 10.7 | 10.7 | ○ | ○ | ◎ |
| EXAMPLE 16 | RuAl, MgO | 1.0 × 10$^{-6}$ | 10.7 | 10.7 | ○ | ○ | ◎ |
| EXAMPLE 17 | RuAl, MgO | 1.0 × 10$^{-6}$ | 10.7 | 10.7 | ○ | ○ | ◎ |
| EXAMPLE 18 | RuAl, MgO | 1.0 × 10$^{-6}$ | 10.7 | 10.7 | ○ | ○ | ◎ |
| EXAMPLE 19 | RuAl, MgO | 1.5 × 10$^{-6}$ | 10.7 | 11 | ○ | ○ | ◎ |
| EXAMPLE 20 | RuAl, Ru$_2$Al$_3$, MgO | 5.0 × 10$^{-6}$ | 10.7 | 12 | ○ | ○ | ○ |
| EXAMPLE 21 | RuAl, MgO | 1.8 × 10$^{-6}$ | 10.7 | 10.8 | ○ | ○ | ◎ |
| EXAMPLE 22 | RuAl, MgO | 2.6 × 10$^{-6}$ | 10.7 | 11 | ○ | ○ | ◎ |
| EXAMPLE 23 | RuAl, MgO | 3.6 × 10$^{-6}$ | 10.7 | 11.3 | ○ | ○ | ◎ |
| EXAMPLE 24 | RuAl, MgO | 5.1 × 10$^{-6}$ | 10.7 | 11.5 | ○ | ○ | ◎ |
| EXAMPLE 25 | RuAl, MgO | 1.0 × 10$^{-6}$ | 10.7 | 10.8 | ○ | ○ | ◎ |
| EXAMPLE 26 | RuAl, MgO | 2.0 × 10$^{-6}$ | 10.7 | 11 | ○ | ○ | ◎ |
| EXAMPLE 27 | RuAl, MgO | 2.8 × 10$^{-6}$ | 10.7 | 11.3 | ○ | ○ | ◎ |
| EXAMPLE 28 | RuAl, MgO | 4.0 × 10$^{-6}$ | 10.7 | 11.5 | ○ | ○ | ◎ |
| COMPARATIVE EXAMPLE 1 | Ru | 6.0 × 10$^{-6}$ | 10.7 | 8 | X | ○ | Δ |
| COMPARATIVE EXAMPLE 2 | Ru$_3$Al$_{13}$, Ru$_2$Al$_3$, MgO | 2.0 × 10$^{-4}$ | 10.7 | 14 | X | X | X |
| COMPARATIVE EXAMPLE 3 | Ru$_3$Al$_{13}$, Ru$_2$Al$_3$, MgO | 1.5 × 10$^{-4}$ | 10.7 | 14 | X | X | X |

[1]The former component has higher peak.

TABLE 7

| | Electrode Crystal Phase[1] | Resistivity Ωcm | Thermal Expansion Coefficient of Base ppm K$^{-1}$ | Thermal Expansion Coefficient of Electorde ppm K$^{-1}$ | Crack | Melting | Reactivity of Electrode Component and Base Material |
|---|---|---|---|---|---|---|---|
| EXAMPLE 29 | RuAl, MgO | $3.0 \times 10^{-5}$ | 13 | 10.7 | ○ | ○ | ⊚ |
| EXAMPLE 30 | RuAl, MgO | $2.6 \times 10^{-5}$ | 13 | 10.7 | ○ | ○ | ⊚ |
| EXAMPLE 31 | RuAl, MgO | $2.9 \times 10^{-5}$ | 13 | 10.7 | ○ | ○ | ⊚ |
| EXAMPLE 32 | RuAl, Ru$_2$Al$_3$, MgO | $5.0 \times 10^{-5}$ | 13 | 12 | ○ | ○ | ○ |
| EXAMPLE 33 | RuAl, MgO | $2.7 \times 10^{-5}$ | 13 | 10.7 | ○ | ○ | ⊚ |
| EXAMPLE 34 | RuAl, MgO | $2.5 \times 10^{-5}$ | 13 | 10.7 | ○ | ○ | ⊚ |
| EXAMPLE 35 | RuAl, MgO | $2.5 \times 10^{-5}$ | 13 | 10.7 | ○ | ○ | ⊚ |
| EXAMPLE 36 | RuAl, Ru$_2$Al$_3$, MgO | $5.0 \times 10^{-5}$ | 13 | 12 | ○ | ○ | ○ |
| EXAMPLE 37 | RuAl, Ru, MgO | $4.3 \times 10^{-5}$ | 11.5 | 9.5 | ○ | ○ | ○ |
| EXAMPLE 38 | RuAl, MgO | $2.5 \times 10^{-5}$ | 11.5 | 10.7 | ○ | ○ | ⊚ |
| EXAMPLE 39 | RuAl, MgO | $2.2 \times 10^{-5}$ | 11.5 | 10.7 | ○ | ○ | ⊚ |
| EXAMPLE 40 | RuAl, Ru$_2$Al$_3$, MgO | $5.0 \times 10^{-5}$ | 11.5 | 12 | ○ | ○ | ○ |
| EXAMPLE 41 | RuAl, Ru, MgO | $3.7 \times 10^{-5}$ | 11.5 | 9.5 | ○ | ○ | ○ |
| EXAMPLE 42 | RuAl, MgO | $2.4 \times 10^{-5}$ | 11.5 | 10.7 | ○ | ○ | ⊚ |
| EXAMPLE 43 | RuAl, MgO | $2.1 \times 10^{-5}$ | 11.5 | 10.7 | ○ | ○ | ⊚ |
| EXAMPLE 44 | RuAl, Ru$_2$Al$_3$, MgO | $5.0 \times 10^{-5}$ | 11.5 | 12 | ○ | ○ | ○ |
| EXAMPLE 45 | Ru, RuAl, MgO | $4.8 \times 10^{-5}$ | 10 | 9 | ○ | ○ | ○ |
| EXAMPLE 46 | RuAl, Ru, MgO | $3.5 \times 10^{-5}$ | 10 | 10 | ○ | ○ | ○ |
| EXAMPLE 47 | RuAl, MgO | $1.5 \times 10^{-5}$ | 10 | 10.7 | ○ | ○ | ⊚ |
| EXAMPLE 48 | RuAl, Ru$_2$Al$_3$, MgO | $5.0 \times 10^{-5}$ | 10 | 12 | ○ | ○ | ○ |
| EXAMPLE 49 | Ru, RuAl, MgO | $4.2 \times 10^{-5}$ | 10 | 9 | ○ | ○ | ○ |
| EXAMPLE 50 | RuAl, Ru, MgO | $3.0 \times 10^{-5}$ | 10 | 10 | ○ | ○ | ○ |
| EXAMPLE 51 | RuAl, MgO | $1.5 \times 10^{-5}$ | 10 | 10.7 | ○ | ○ | ⊚ |
| EXAMPLE 52 | RuAl, Ru$_2$Al$_3$, MgO | $5.0 \times 10^{-5}$ | 10 | 12 | ○ | ○ | ○ |
| EXAMPLE 53 | Ru, RuAl, MgO | $4.7 \times 10^{-5}$ | 9 | 9 | ○ | ○ | ○ |
| EXAMPLE 54 | RuAl, Ru, MgO | $3.6 \times 10^{-5}$ | 9 | 10 | ○ | ○ | ○ |
| EXAMPLE 55 | RuAl, MgO | $1.5 \times 10^{-5}$ | 9 | 10.7 | ○ | ○ | ⊚ |
| EXAMPLE 56 | Ru, RuAl, MgO | $3.9 \times 10^{-5}$ | 9 | 9 | ○ | ○ | ○ |
| EXAMPLE 57 | RuAl, Ru, MgO | $3.1 \times 10^{-5}$ | 9 | 10 | ○ | ○ | ○ |
| EXAMPLE 58 | RuAl, MgO | $1.4 \times 10^{-5}$ | 9 | 10.7 | ○ | ○ | ⊚ |
| EXAMPLE 59 | RuAl | $1.0 \times 10^{-5}$ | 10.7 | 10.5 | ○ | ○ | ⊚ |
| EXAMPLE 60 | RuAl | $0.9 \times 10^{-5}$ | 10.7 | 10.5 | ○ | ○ | ⊚ |

[1]The former component has higher peak.

TABLE 8

| | Electrode Crystal Phase[1] | Resistivity Ωcm | Thermal Expansion Coefficient of Base ppm K$^{-1}$ | Thermal Expansion Coefficient of Electorde ppm K$^{-1}$ | Crack | Melting | Reactivity of Electrode Component and Base Material |
|---|---|---|---|---|---|---|---|
| EXAMPLE 61 | RuAl, ZrO$_2$ | $5.0 \times 10^{-6}$ | 11.5 | 10 | ○ | ○ | ○ |
| EXAMPLE 62 | RuAl | $3.5 \times 10^{-6}$ | 11.5 | 10.5 | ○ | ○ | ⊚ |
| EXAMPLE 63 | RuAl, ZrO$_2$ | $4.9 \times 10^{-6}$ | 11.5 | 12 | ○ | ○ | ○ |
| EXAMPLE 64 | RuAl, ZrO$_2$ | $4.6 \times 10^{-6}$ | 11.5 | 10 | ○ | ○ | ○ |
| EXAMPLE 65 | RuAl | $3.1 \times 10^{-6}$ | 11.5 | 10.5 | ○ | ○ | ⊚ |
| EXAMPLE 66 | RuAl, ZrO$_2$ | $4.8 \times 10^{-6}$ | 11.5 | 12 | ○ | ○ | ○ |
| EXAMPLE 67 | RuAl, 3Y—ZrO$_2$ | $4.9 \times 10^{-6}$ | 11 | 9.5 | ○ | ○ | ○ |
| EXAMPLE 68 | RuAl | $3.4 \times 10^{-6}$ | 11 | 10.5 | ○ | ○ | ⊚ |
| EXAMPLE 69 | RuAl, 3Y—ZrO$_2$ | $4.8 \times 10^{-6}$ | 11 | 12 | ○ | ○ | ○ |
| EXAMPLE 70 | RuAl, 3Y—ZrO$_2$ | $4.2 \times 10^{-6}$ | 11 | 9 | ○ | ○ | ○ |
| EXAMPLE 71 | RuAl | $3.1 \times 10^{-6}$ | 11 | 10.5 | ○ | ○ | ⊚ |
| EXAMPLE 72 | RuAl, 3Y—ZrO$_2$ | $4.5 \times 10^{-6}$ | 11 | 12 | ○ | ○ | ○ |
| EXAMPLE 73 | RuAl, 8Y—ZrO$_2$ | $3.6 \times 10^{-6}$ | 10.5 | 9.5 | ○ | ○ | ○ |
| EXAMPLE 74 | RuAl | $3.2 \times 10^{-6}$ | 10.5 | 10.5 | ○ | ○ | ⊚ |
| EXAMPLE 75 | RuAl, 8Y—ZrO$_2$ | $4.9 \times 10^{-6}$ | 10.5 | 12 | ○ | ○ | ○ |
| EXAMPLE 76 | RuAl, 8Y—ZrO$_2$ | $3.2 \times 10^{-6}$ | 10.5 | 9.5 | ○ | ○ | ○ |
| EXAMPLE 77 | RuAl | $2.9 \times 10^{-6}$ | 10.5 | 10.5 | ○ | ○ | ⊚ |
| EXAMPLE 78 | RuAl, 8Y—ZrO$_2$ | $4.6 \times 10^{-6}$ | 10.5 | 12 | ○ | ○ | ○ |
| EXAMPLE 79 | RuAl | $4.1 \times 10^{-6}$ | 11 | 10.5 | ○ | ○ | ⊚ |
| EXAMPLE 80 | RuAl | $4.0 \times 10^{-6}$ | 11 | 10.5 | ○ | ○ | ⊚ |
| EXAMPLE 81 | RuAl, 3Y—ZrO$_2$, Al$_2$O$_3$ | $4.9 \times 10^{-6}$ | 10 | 9 | ○ | ○ | ○ |
| EXAMPLE 82 | RuAl | $3.3 \times 10^{-6}$ | 10 | 10.5 | ○ | ○ | ⊚ |
| EXAMPLE 83 | RuAl, 3Y—ZrO$_2$, Al$_2$O$_3$ | $3.6 \times 10^{-6}$ | 10 | 11 | ○ | ○ | ○ |
| EXAMPLE 84 | RuAl, 3Y—ZrO$_2$, Al$_2$O$_3$ | $4.5 \times 10^{-6}$ | 10 | 9 | ○ | ○ | ○ |

TABLE 8-continued

|  | Electrode Crystal Phase[1] | Resistivity Ωcm | Thermal Expansion Coefficient of Base ppm K$^{-1}$ | Thermal Expansion Coefficient of Electorde ppm K$^{-1}$ | Crack | Melting | Reactivity of Electrode Component and Base Material |
|---|---|---|---|---|---|---|---|
| EXAMPLE 85 | RuAl | $2.9 \times 10^{-6}$ | 10 | 10.5 | ◯ | ◯ | ◎ |
| EXAMPLE 86 | RuAl, 3Y—ZrO$_2$, Al$_2$O$_3$ | $3.4 \times 10^{-6}$ | 10 | 11 | ◯ | ◯ | ◯ |

[1])The formar component has higher peak.
3Y:ZrO$_2$ containing 3 mol % of Y$_2$O$_3$,
8Y:ZrO$_2$ containing 8 mol % of Y$_2$O$_3$.

The present application claims priority from Japanese Patent Application No 2013-060006 filed on Mar. 22, 2013, the entire contents of which are incorporated herein by reference.

What is claimed is:

1. A ceramic member comprising:
   a ceramic base containing at least one of magnesium oxide, a magnesium oxide solid solution in which a predetermined component is dissolved in magnesium oxide, and zirconium oxide; and
   an electrode arranged on part of the ceramic base, the electrode containing a ruthenium-aluminum alloy serving as an electrode component.

2. The ceramic member according to claim 1, wherein the electrode further contains at least one selected from Mg, Zr, Y, Ca, Ce, Al, N, and O serving as the electrode components.

3. The ceramic member according to claim 1, wherein the proportion of Ru in a raw material for the formation of the electrode is more than 20% by mole and 95% by mole or less with respect to the total of Ru and Al.

4. The ceramic member according to claim 1, wherein the electrode is a sintered electrode made from a ruthenium-aluminum alloy powder serving as a raw material.

5. The ceramic member according to claim 1, wherein the electrode is a sintered electrode made from a ruthenium powder and an aluminum powder serving as raw materials.

6. The ceramic member according to claim 1, wherein the electrode has a thickness of 1 μm or more and 200 μm or less.

7. The ceramic member according to claim 1, wherein the ceramic base contains the magnesium oxide solid solution containing Mg(Al)O(N) in which Al and N components are dissolved in magnesium oxide, the Mg(Al)O(N) serving as a main phase.

8. The ceramic member according to claim 7, wherein the ceramic base contains the magnesium oxide solid solution containing the Mg(Al)O(N), wherein an XRD peak corresponding to the (111) plane of the Mg(Al)O(N) appears at 2θ=36.9 to 39°, an XRD peak corresponding to the (200) plane of the Mg(Al)O(N) appears at 42.9 to 44.8°, or an XRD peak corresponding to the (220) plane of the Mg(Al)O(N) appears at 62.3 to 65.2°, the XRD peaks being measured with CuKα radiation and located between a peak of cubic magnesium oxide and a peak of cubic aluminum nitride.

9. The ceramic member according to claim 7, wherein the ceramic base contains the magnesium oxide solid solution containing the Mg(Al)O(N), wherein an XRD peak corresponding to the (200) plane of the Mg(Al)O(N) appears at 2θ=42.92° or more or an XRD peak corresponding to the (220) plane appears at 62.33° or more.

10. The ceramic member according to claim 7, wherein the ceramic base contains the magnesium oxide solid solution containing the Mg(Al)O(N), wherein the integral breadth of the XRD peak corresponding to the (200) plane of the Mg(Al)O(N) is 0.50° or less.

11. The ceramic member according to claim 1, wherein the ceramic base contains the magnesium oxide solid solution free from an AlN crystal phase.

12. The ceramic member according to claim 1, wherein the ceramic base contains the magnesium oxide solid solution that contains a Mg—Al oxynitride phase serving as a sub-phase, wherein the XRD peak of the Mg—Al oxynitride phase measured with CuKα radiation appears at at least 2θ=47 to 49°.

13. The ceramic member according to claim 1, wherein the ceramic base contains the magnesium oxide solid solution that has a magnesium oxide content of 49% by mass or more and 99% by mass or less, an aluminum nitride content of 0.5% by mass or more and 25% by mass or less, and an alumina content of 0.5% by mass or more and 30% by mass or less, in terms of the composition of a powder mixture.

14. The ceramic member according to claim 1, wherein the ceramic base contains the zirconium oxide containing a stabilizer.

15. A member for semiconductor manufacturing equipment, comprising the ceramic member according to claim 1.

* * * * *